(12) United States Patent
Wang

(10) Patent No.: US 12,477,922 B2
(45) Date of Patent: Nov. 18, 2025

(54) LIGHT-EMITTING DEVICE AND MANUFACTURING METHOD THEREFOR, AND DISPLAY DEVICE

(71) Applicants: Beijing BOE Technology Development Co., Ltd., Beijing (CN); BOE Technology Group Co., Ltd., Beijing (CN)

(72) Inventor: Haowei Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 109 days.

(21) Appl. No.: 18/030,090

(22) PCT Filed: Jun. 22, 2021

(86) PCT No.: PCT/CN2021/101604
§ 371 (c)(1),
(2) Date: Apr. 4, 2023

(87) PCT Pub. No.: WO2022/266852
PCT Pub. Date: Dec. 29, 2022

(65) Prior Publication Data
US 2023/0371295 A1 Nov. 16, 2023

(51) Int. Cl.
*H10K 59/38* (2023.01)
*H10K 50/115* (2023.01)
(Continued)

(52) U.S. Cl.
CPC ........... *H10K 59/38* (2023.02); *H10K 50/115* (2023.02); *H10K 50/125* (2023.02); *H10K 50/15* (2023.02);
(Continued)

(58) Field of Classification Search
None
See application file for complete search history.

(56) References Cited

U.S. PATENT DOCUMENTS

2015/0085223 A1  3/2015  Park et al.
2015/0301408 A1  10/2015 Li
(Continued)

FOREIGN PATENT DOCUMENTS

CN  103278876 A  9/2013
CN  104465911 A  3/2015
(Continued)

OTHER PUBLICATIONS

Supplemental European Search Report for EP 21946354 dated Dec. 4, 2023.
(Continued)

*Primary Examiner* — Anthony Ho
(74) *Attorney, Agent, or Firm* — ArentFox Schiff LLP; Michael Fainberg

(57) ABSTRACT

A light-emitting device and a manufacturing method therefor, and a display device are disclosed. The light-emitting device includes a plurality of pixel units. Each pixel unit includes at least n sub-pixels capable of emitting light of n different colors. Each sub-pixel includes: a first electrode and a second electrode arranged oppositely; a light-emitting layer located between the first electrode and the second electrode, in at least one pixel unit, the light-emitting layer of the at least one sub-pixel includes a host quantum dot and at least one residual quantum dot emitting light of color different from the host quantum dot; and a color filter layer located on the side of the first electrode or the second electrode away from the light-emitting layer. The color filter layer is configured to pass through light emitted by the host quantum dot, and prevent light emitted by the residual quantum dot from passing through.

20 Claims, 11 Drawing Sheets

(51) Int. Cl.
 *H10K 50/125* (2023.01)
 *H10K 50/15* (2023.01)
 *H10K 59/80* (2023.01)
 *H10K 71/40* (2023.01)
 *H10K 85/30* (2023.01)

(52) U.S. Cl.
 CPC ......... *H10K 59/876* (2023.02); *H10K 71/421* (2023.02); *H10K 85/30* (2023.02)

(56) References Cited

U.S. PATENT DOCUMENTS

| | | |
|---|---|---|
| 2018/0219183 A1 | 8/2018 | Song |
| 2018/0219185 A1 | 8/2018 | Liu |
| 2019/0058013 A1 | 2/2019 | Lee |
| 2019/0074324 A1 | 3/2019 | Kim et al. |
| 2019/0157354 A1 | 5/2019 | Lee et al. |
| 2019/0302548 A1 | 10/2019 | Lee et al. |
| 2019/0305241 A1 | 10/2019 | Angioni et al. |
| 2020/0219858 A1 | 7/2020 | Chang |
| 2021/0043863 A1 | 2/2021 | Jung |
| 2021/0343793 A1 | 11/2021 | Weng et al. |
| 2021/0388259 A1 | 12/2021 | Mei et al. |

FOREIGN PATENT DOCUMENTS

| | | |
|---|---|---|
| CN | 106356463 A | 1/2017 |
| CN | 108766273 A | 11/2018 |
| CN | 109411512 A | 3/2019 |
| CN | 109656050 A | 4/2019 |
| CN | 110323348 A | 10/2019 |
| CN | 110590549 A | 12/2019 |
| CN | 110767716 A | 2/2020 |
| CN | 110809824 A | 2/2020 |
| CN | 110853528 A | 2/2020 |
| CN | 111430444 A | 7/2020 |
| CN | 111900256 A | 11/2020 |
| CN | 112234155 A | 1/2021 |
| CN | 112375497 A | 2/2021 |
| KR | 10-2017-0067307 A | 6/2017 |

OTHER PUBLICATIONS

Office Action and Search Report received for Chinese Patent Application No. 202180001582.3, mailed on Aug. 12, 2025, 15 pages (7 pages of English Translation and 8 pages of Original Document).

LIGHT-EMITTING DEVICE AND MANUFACTURING METHOD THEREFOR, AND DISPLAY DEVICE

FIELD

The disclosure relates to the field of display technology, and particularly to a light-emitting device and a manufacturing method therefor, and a display apparatus.

BACKGROUND

The Quantum Dot (QD), also known as semiconductor nanocrystal or semiconductor nanoparticle, has the size on the order of nanometers in three dimensions of space, or the nano-solid material composed of QDs as basic units is a collection of atoms and molecules on the nanometer scale. A light-emitting diode based on a quantum dot material is called Quantum dot Light-Emitting Diode (QLED), and is a new type of light-emitting device.

SUMMARY

A light-emitting device provided by an embodiment of the disclosure includes a plurality of pixel units, each of the pixel units includes at least n sub-pixels capable of emitting light of n different colors, where:
each of the sub-pixels includes:
a first electrode and a second electrode arranged oppositely;
a light-emitting layer located between the first electrode and the second electrode, where a light-emitting layer of at least one sub-pixel in at least one of the pixel units includes a host quantum dot and at least one residual quantum dot of a different luminous color from the host quantum dot;
a color filter layer located on a side of the first electrode or the second electrode away from the light-emitting layer, and configured to transmit light emitted by the host quantum dot and prevent light emitted by the residual quantum dot from passing through.

Optionally, in the above-mentioned light-emitting device provided by an embodiment of the disclosure, a surface of the host quantum dot is connected with a structure as shown in a general formula X:

A-B'  (X);

where A is a coordination unit, and B' is a residual unit;
the coordination unit includes at least one of a mercapto group, a hydroxyl group, an amino group, a carboxyl group, a phosphoric acid group, a phosphatide group or a sulfonic acid group;
the residual unit includes at least one of structures shown in following formulas;

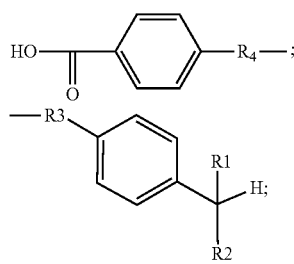

—$R_5$—OH, —$R_6$—H, —$R_7$—OH, or —$R_8$—H;
where $R_1$ is selected from hydrogen, alkoxy, alkyl or aryl; and $R_2$ is selected from hydrogen, alkoxy, alkyl or aryl; $R_3$ is selected from hydrogen, alkylene or arylene; $R_4$ is selected from hydrogen, alkylene or arylene; $R_5$ is selected from hydrogen, alkylene or arylene; $R_6$ is selected from hydrogen, alkylene or arylene; $R_7$ is selected from hydrogen, alkylene or arylene; and $R_8$ is selected from hydrogen, alkylene or arylene.

Optionally, in the above-mentioned light-emitting device provided by an embodiment of the disclosure, a surface of the host quantum dot is connected with a cross-linked network.

Optionally, in the above-mentioned light-emitting device provided by an embodiment of the disclosure, the cross-linked network is formed by cross-linking a group pair R9 and R10, and the R9 and R10 are respectively cross-linkable ligands before the cross-linked network is formed on the surface of the host quantum dot.

Optionally, in the above-mentioned light-emitting device provided by an embodiment of the disclosure, the cross-linked network is formed by cross-linking a cross-linking agent and a group R11, the group R11 is a cross-linkable ligand before the cross-linked network is formed on the surface of the host quantum dot.

Optionally, in the above-mentioned light-emitting device provided by an embodiment of the disclosure, in the light-emitting layer of the sub-pixel including the residual quantum dot, a molar ratio of the residual quantum dot to all quantum dots is less than 10%.

Optionally, in the above-mentioned light-emitting device provided by an embodiment of the disclosure, each of the pixel units includes a red sub-pixel, a green sub-pixel and a blue sub-pixel, the red sub-pixel includes a red host quantum dot, the green sub-pixel includes a green host quantum dot, and the blue sub-pixel includes a blue host quantum dot.

Optionally, in the above-mentioned light-emitting device provided by an embodiment of the disclosure, in the light-emitting layer of the sub-pixel including the residual quantum dot, a molar ratio of residual quantum dots to all quantum dots in the red sub-pixel, a molar ratio of residual quantum dots to all quantum dots in the green sub-pixel, and a molar ratio of residual quantum dots to all quantum dots in the blue sub-pixel decrease sequentially.

Optionally, in the above-mentioned light-emitting device provided by an embodiment of the disclosure, the color filter layer includes a plurality of color resists of different colors in one-to-one correspondence with sub-pixels emitting light of different colors.

Optionally, in the above-mentioned light-emitting device provided by an embodiment of the disclosure, the color filter layer includes a plurality of optical modulation parts corresponding to the sub-pixels, and each of the sub-pixels includes one of the optical modulation parts;
an optical modulation part corresponding to the red sub-pixel is a first long-pass filter, a starting wavelength of the first long-pass filter is less than a wavelength corresponding to a luminous peak of the red host quantum dot and greater than a wavelength corresponding to a luminous peak of the green host quantum dot;
an optical modulation part corresponding to the blue sub-pixel is a short-pass filter, a cut-off wavelength of the short-pass filter is less than the wavelength corresponding to the luminous peak of the green host quantum dot and greater than a wavelength corresponding to a luminous peak of the blue host quantum dot; and an optical modulation part corresponding to the green sub-pixel is a second long-pass filter, a starting wavelength of the second long-pass filter is less than the wavelength corresponding to the luminous peak of the green host quantum dot and greater than the wavelength corresponding to the luminous peak of the blue host quantum dot.

Optionally, in the above-mentioned light-emitting device provided by an embodiment of the disclosure, the color filter layer includes a plurality of optical modulation parts corresponding to the sub-pixels, and each of the sub-pixels includes one of the optical modulation parts;

an optical modulation part corresponding to the red sub-pixel is a first band-pass filter, a starting wavelength of the first band-pass filter is less than a wavelength corresponding to a luminous peak of the red host quantum dot and greater than a wavelength corresponding to a luminous peak of the green host quantum dot, and a cut-off wavelength of the first band-pass filter is greater than the wavelength corresponding to the luminous peak of the red host quantum dot;

an optical modulation part corresponding to the green sub-pixel is a second band-pass filter, a starting wavelength of the second band-pass filter is less than the wavelength corresponding to the luminous peak of the green host quantum dot and greater than a wavelength corresponding to a luminous peak of the blue host quantum dot, and a cut-off wavelength of the second band-pass filter is greater than the wavelength corresponding to the luminous peak of the green host quantum dot and less than the wavelength corresponding to the luminous peak of the red host quantum dot;

an optical modulation part corresponding to the blue sub-pixel is a third band-pass filter, a starting wavelength of the third band-pass is less than the wavelength corresponding to the luminous peak of the blue host quantum dot, and a cut-off wavelength of the third band-pass is greater than the wavelength corresponding to the luminous peak of the blue host quantum dot and less than the wavelength corresponding to the luminous peak of the green host quantum dot.

Optionally, in the above-mentioned light-emitting device provided by an embodiment of the disclosure, the color filter layer includes a plurality of optical modulation parts corresponding to the sub-pixels, and each of the sub-pixels includes two optical modulation parts stacked; one of the optical modulation parts in the red sub-pixel prevents blue light from passing through, and another one of the optical modulation parts in the red sub-pixel prevents green light from passing through; one of the optical modulation parts in the green sub-pixel prevents blue light from passing through, and another one of the optical modulation parts in the green sub-pixel prevents red light from passing through; one of the optical modulation parts in the blue sub-pixel prevents red light from passing through, and another one of the optical modulation parts in the blue sub-pixel prevents green light from passing through.

Optionally, in the above-mentioned light-emitting device provided by an embodiment of the disclosure, the optical modulation part includes at least one first film layer and at least one second film layer alternately stacked; and a refractive index of the first film layer is different from a refractive index of the second film layer.

Optionally, in the above-mentioned light-emitting device provided by an embodiment of the disclosure, the first electrode is a transparent electrode, and the second electrode is a reflective electrode; and the optical modulation part is located on a side of the first electrode away from the second electrode.

Optionally, in the above-mentioned light-emitting device provided by an embodiment of the disclosure, the first electrode is a reflective electrode, and the second electrode partially transmits and partially reflects light in a visible light band; and the optical modulation part is located on a side of the second electrode away from the first electrode.

Optionally, in the above-mentioned light-emitting device provided by an embodiment of the disclosure, materials of first film layers in optical modulation parts that reflect light of different colors are same, and materials of second film layers in the optical modulation parts that reflect light of different colors are same;

thicknesses of the first film layers are same; and a thickness of a second film layer in an optical modulation part reflecting red light, a thickness of a second film layer in an optical modulation part reflecting green light, and a thickness of a second film layer in an optical modulation part reflecting blue light decrease sequentially; or thicknesses of the second film layers are same; and a thickness of a first film layer in an optical modulation part reflecting red light, a thickness of a first film layer in an optical modulation part reflecting green light, and a thickness of a first film layer in an optical modulation part reflecting blue light decrease sequentially.

Optionally, in the above-mentioned light-emitting device provided by an embodiment of the disclosure, a material of the first film layer includes InGaAsP, InAlGaN, SiO2, TiO2, Si3N4, Au or Ag; a material of the second film layer includes InGaAsP, InAlGaN, SiO2, TiO2, Si3N4, Au or Ag; and the material of the first film layer is different from the material of the second film layer.

Optionally, in the above-mentioned light-emitting device provided by an embodiment of the disclosure, the optical modulation part includes at least one first film layer and at least one second film layer alternately stacked;

the first electrode is a reflective electrode, the second electrode partially transmits and partially reflects light in a visible light band, and the optical modulation parts are located on a side of the second electrode away from the first electrode;

when a color of light emitted by the host quantum dot in the light-emitting layer is blue, a material of the first film layer is SiO2, a material of the second film layer is Si3N4, a thickness of the first film layer closest to the second electrode is 5 nm to 15 nm, and a thickness of the second film layer closest to the second electrode is approximately 35 nm to 45 nm;

when a color of light emitted by the host quantum dot in the light-emitting layer is red, a material of the first film layer is SiO2, a material of the second film layer is Si3N4, a thickness of the first film layer closest to the second electrode is 55 nm to 65 nm, and a thickness of the second film layer closest to the second electrode is approximately 55 nm to 65 nm;

when a color of light emitted by the host quantum dot in the light-emitting layer is green, a material of the first film layer is SiO2, a material of the second film layer is Si3N4, a thickness of the first film layer closest to the second electrode is 15 nm to 25 nm, and a thickness of the second film layer closest to the second electrode is approximately 55 nm to 65 nm.

Optionally, the above-mentioned light-emitting device provided by an embodiment of the disclosure further includes: an electron transport layer between the first electrode and the light-emitting layer, a hole injection layer between the light-emitting layer and the second electrode, and a hole transport layer between the hole injection layer and the light-emitting layer; where a material of the electron transport layer includes an inorganic electron transport material;

or, the light-emitting device further includes: a hole transport layer between the first electrode and the light-emitting layer, a hole injection layer between the first electrode and the hole transport layer, and an electron transport layer between the light-emitting layer and the second electrode; where the hole transport layer includes an inorganic hole transport material.

Optionally, in the above-mentioned light-emitting device provided by an embodiment of the disclosure, the host quantum dot includes at least one of CdS, CdSe, CdTe, ZnSe, InP, PbS, CuInS2, ZnO, CsPbCl3, CsPbBr3, CsPhI3, CdS/ZnS, CdSe/ZnS, ZnSe, InP/ZnS, PbS/ZnS, InAs, InGaAs, InGaN, GaNk, ZnTe, Si, Ge, C, nanorod.

Correspondingly, an embodiment of the disclosure further provides a manufacturing method for the above-mentioned light-emitting device, including:

preparing a first electrode, a second electrode, a light-emitting layer and a color filter layer in each of the sub-pixels; where a light-emitting layer of at least one sub-pixel in at least one of the pixel units includes a host quantum dot and at least one residual quantum dot of a different luminous color from the host quantum dot;

the color filter layer is located on a side of the first electrode or the second electrode away from the light-emitting layer, and configured to transmit light emitted by the host quantum dot and prevent light emitted by the residual quantum dot from passing through.

Optionally, in the above-mentioned manufacturing method provided by an embodiment of the disclosure, preparing the light-emitting layer, includes:

providing a base;

coating a mixture including a host quantum dot on the base to form a quantum dot film; where a surface of the host quantum dot is connected with a structure as shown in a general formula I:

A-B—C (I);

where A is a coordination unit, B is a cracking unit, and C is an adhesion adjustment unit;

the coordination unit includes any one of a mercapto group, a hydroxyl group, an amino group, a carboxyl group, a phosphoric acid group, a phosphatide group or a sulfonic acid group;

the cracking unit has a structure as shown in formulas II to IV;

the adhesion adjustment unit is a perfluoroalkyl group including more than 3 carbon atoms, or a group including more than 8 hydrophilic functional groups, or a molecular chain including more than 8 hydrophilic functional groups; where the hydrophilic functional group is a hydroxyl group, an aldehyde group, an ester group or an ether group;

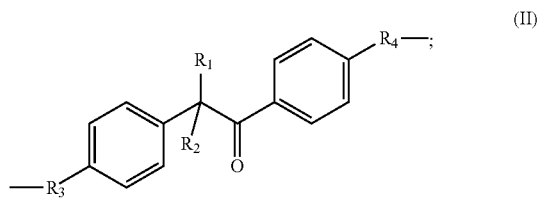

(II)

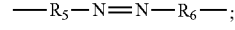

(III)

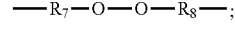

(IV)

where $R_1$ is selected from hydrogen, alkoxy, alkyl or aryl; and $R_2$ is selected from hydrogen, alkoxy, alkyl or aryl; $R_3$ is selected from hydrogen, alkylene or arylene; $R_4$ is selected from hydrogen, alkylene or arylene; $R_5$ is selected from hydrogen, alkylene or arylene; $R_6$ is selected from hydrogen, alkylene or arylene; $R_7$ is selected from hydrogen, alkylene or arylene; and $R_8$ is selected from hydrogen, alkylene or arylene; where, for a structure shown in the general formula I, the base has hydrophobic property when the adhesion adjustment unit has hydrophilic property; or the base has hydrophilic property when the adhesion adjustment unit has hydrophobic property;

exposing a quantum dot film in a predetermined area using ultraviolet light, where the cracking unit in the general formula I undergoes a photolysis reaction, a molecular chain segment including the adhesion adjustment unit falls off a quantum dot surface after decomposition, and a structure of a general formula X is formed on a surface of the host quantum dot;

removing an unexposed quantum dot film by washing using an organic solvent, and forming a patterned light-emitting layer after drying.

Optionally, in the above-mentioned manufacturing method provided by an embodiment of the disclosure, preparing the light-emitting layer, includes:

providing a base;

forming a film layer of a cross-linkable host quantum dot on the base;

irradiating a reserved area of the film layer using light of a predetermined wavelength; where a surface of the cross-linkable host quantum dot is cross-linked to form a cross-linked network under irradiation of the light of the predetermined wavelength;

removing a host quantum dot that is not irradiated by the light of the predetermined wavelength to form a patterned light-emitting layer in the reserved area.

Correspondingly, an embodiment of the disclosure further provides a display apparatus, including the above-mentioned light-emitting device.

DETAILED DESCRIPTION OF EMBODIMENTS

Figure 1:
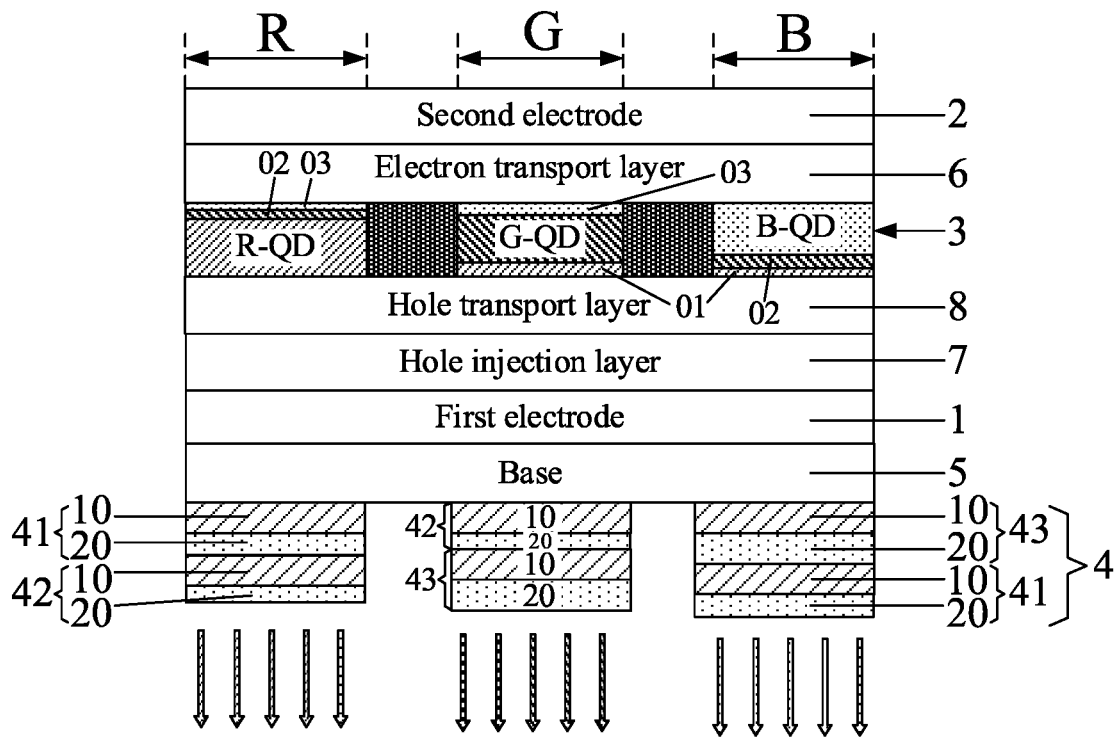
FIG. 1 is a schematic structural diagram of a light-emitting device according to an embodiment of the disclosure.

In order to make purposes, technical solutions and advantages of the disclosure clearer, the technical solutions of embodiments of the disclosure will be described clearly and completely below in combination with accompanying drawings of embodiments of the disclosure. Obviously the described embodiments are a part of embodiments of the disclosure but not all embodiments. Also in the case of no conflict, embodiments and the features therein in the disclosure can be combined with each other. Based upon embodiments of the disclosure, all of other embodiments obtained by those ordinary skilled in the art without creative work pertain to the protection scope of the disclosure.

Unless otherwise defined, the technical or scientific terms used in the disclosure shall have the general meaning understood by those ordinary skilled in the art to which the disclosure belongs. The word such as "include" or "comprise" or the like used in the disclosure means that the element or object appearing before this word encompasses the elements or objects and their equivalents listed after this word, without excluding other elements or objects. The word such as "connect" or "connected" or the like is not limited to the physical or mechanical connection, but can include the electrical connection, whether direct or indirect. The words such as "inner", "outer", "up", "down" are only used to represent the relative position relationship. When the absolute position of a described object changes, the relative position relationship may also change accordingly.

It should be noted that the size and shape of each diagram in the accompanying drawings do not reflect the true proportion, and are merely for purpose of schematically illustrating the content of the disclosure. Also, the same or similar reference numbers represent the same or similar elements or the elements having the same or similar functions all the way.

Quantum dot patterning is the key to realizing the high-resolution and full-color QLED device. The colloidal solution of quantum dots can be patterned by printing, transfer printing, photolithography, etc., but the printing equipment is expensive and the resolution of the printing equipment is limited, so electronic materials (quantum dots) can be patterned by photolithography. However, when the full-color QLED is patterned by photolithography, it is easy to cause a problem of color mixing due to residual quantum dots (for example, a red sub-pixel should only emit red light, but also emit light including weak green or blue light peaks).

For that reason, a light-emitting device provided by an embodiment of the disclosure includes a plurality of pixel units, the plurality of pixel units may be distributed in an array. Taking one pixel unit as an example, as shown in FIG. 1 to FIG. 6B, each pixel unit includes at least n sub-pixels capable of emitting light of n different colors (for example, each pixel unit includes a red sub-pixel R, a green sub-pixel G and a blue sub-pixel B, and of course, the disclosure is not limited thereto), and each sub-pixel includes: a first electrode 1 and a second electrode 2 arranged oppositely; a light-emitting layer 3 located between the first electrode 1 and the second electrode 2, where a light-emitting layer 3 of at least one sub-pixel in at least one of the pixel units includes a host quantum dot and at least one residual quantum dot of a different luminous color from the host quantum dot; for example, the light-emitting layer 3 of the red sub-pixel R includes a red host quantum dot R-QD and a green residual quantum dot and/or a blue residual quantum dot, the light-emitting layer 3 of the green sub-pixel G includes a green host quantum dot G-QD and a red residual quantum dot and/or a blue residual quantum dot, and the light-emitting layer 3 of the blue sub-pixel B includes a blue host quantum dot B-QD and a red residual quantum dot and/or a green residual quantum dot; a color filter layer 4 located on a side of the first electrode 1 or the second electrode 2 away from the light-emitting layer 3, and configured to transmit light emitted by the host quantum dot and prevent light emitted by the residual quantum dot from passing through.

It should be noted that the way to prevent the light emitted by the residual quantum dot from passing through may be to absorb or reflect the light emitted by the residual quantum dot. The action of preventing the light emitted by the residual quantum dot from passing through may be understood as: transmittance of the light emitted by the residual quantum dot in the color filter layer is less than or equal to 20%. The color filter layer is configured to transmit the light emitted by the host quantum dot, which can be understood as: transmittance of the light emitted by the host quantum dot in the color filter layer is greater than or equal to 40%.

An embodiment of the disclosure takes n=3 as an example, that is, each pixel unit includes 3 sub-pixels (R, G, B) capable of emitting light of 3 different colors. The light-emitting layer 3 of the red sub-pixel R also has at least one residual quantum dot (the disclosure takes two residual quantum dots of green residual quantum dot 02 and blue residual quantum dot 03 as an example) in addition to the red host quantum dot R-QD; the light-emitting layer 3 of the green sub-pixel G also has at least one residual quantum dot (the disclosure takes two residual quantum dots of red residual quantum dot 01 and blue residual quantum dot 03 as an example) in addition to the green host quantum dot G-QD; and the light-emitting layer 3 of the blue sub-pixel B also has at least one residual quantum dot (the disclosure takes two residual quantum dots of red residual quantum dot 01 and green residual quantum dot 02 as an example) in addition to the blue host quantum dot B-QD. The color filter layer may filter out the green light emitted by the green residual quantum dot 02 and the blue light emitted by the blue residual quantum dot 03 in the red sub-pixel R, thereby solving the problem of color mixing in the red sub-pixel R and improving color purity of the red sub-pixel R; the color filter layer may filter out the red light emitted by the red residual quantum dot 01 and the blue light emitted by the blue residual quantum dot 03 in the green sub-pixel G, thereby solving the problem of color mixing in the green sub-pixel G and improving color purity of the green sub-pixel G; and the color filter layer may filter out the red light emitted by the red residual quantum dot 01 and the green light emitted by the green residual quantum dot 02 in the blue sub-pixel B, thereby solving the problem of color mixing in the blue sub-pixel B and improving color purity of the blue sub-pixel B. Further, color gamut of the light-emitting device can be increased, and the display effect can be improved.

In the above-mentioned light-emitting device provided by an embodiment of the disclosure, by arranging the color filter layer on the side of the first electrode or the second electrode away from the light-emitting layer, on the one hand, the light with a color different from the light emitted by the light-emitting layer can be eliminated, thereby solving the problem of color mixing when patterning quantum dots by photolithography; and on the other hand, the purity of luminous color can be improved, thereby improving the color gamut of the light-emitting device.

It should be noted that the red residual quantum dot 01, green residual quantum dot 02 and blue residual quantum dot 03 in FIGS. 1-6B are only schematic description and do not represent real patterns of these three residual quantum dots. During practical fabrication, these three residual quantum dots may remain irregularly in the host quantum dots.

A luminous wavelength range of the red host quantum dot R-QD may be 610 nm to 640 nm, a luminous wavelength range of the green host quantum dot G-QD may be 510 nm to 540 nm, and a luminous wavelength range of the blue host quantum dot B-QD may be 420 nm to 460 nm.

In a specific implementation, in the above-mentioned light-emitting device provided by an embodiment of the disclosure, a surface of the host quantum dot (such as red host quantum dots R-QD, green host quantum dots G-QD, or blue host quantum dots B-QD) may be connected with a structure as shown in a general formula X:

$$A\text{-}B' \qquad (X);$$

where A is a coordination unit, and B' is a residual unit;

the coordination unit includes at least one of a mercapto group, a hydroxyl group, an amino group, a carboxyl group, a phosphoric acid group, a phosphatide group or a sulfonic acid group;

the residual unit includes at least one of structures shown in following formulas;

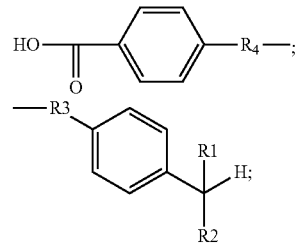

—$R_5$—OH, —$R_6$—H, —$R_7$—OH, or —$R_8$—H;

where $R_1$ is selected from hydrogen, alkoxy, alkyl or aryl; and $R_2$ is selected from hydrogen, alkoxy, alkyl or aryl; $R_3$ is selected from hydrogen, alkylene or arylene; $R_4$ is selected from hydrogen, alkylene or arylene; $R_5$ is selected from hydrogen, alkylene or arylene; $R_6$ is selected from hydrogen, alkylene or arylene; $R_7$ is selected from hydrogen, alkylene or arylene; and $R_8$ is selected from hydrogen, alkylene or arylene.

The above-mentioned residual unit may be a group generated after the cracking unit (described later) is cracked after being irradiated using ultraviolet light. In this way, the light-emitting layer provided by an embodiment of the disclosure can use quantum dots with photolysis ligands, and the photolysis ligands are cracked after being irradiated by ultraviolet light. Solubility of the quantum dots varies before and after being cracked, thereby realizing the photolithography patterning.

In a specific implementation, in the above-mentioned light-emitting device provided by an embodiment of the disclosure, a surface of the host quantum dot (such as red host quantum dots R-QD, green host quantum dots G-QD, or blue host quantum dots B-QD) may be connected with a cross-linked network.

In a specific implementation, in the above-mentioned light-emitting device provided by an embodiment of the disclosure, the cross-linked network may be formed by cross-linking a group pair R9 and R10, and the R9 and R10 are respectively cross-linkable ligands before the cross-linked network is formed on the surface of the host quantum dot. R9 is selected from at least one of a mercapto group, an alkenyl group or a dienyl group; and R10 corresponding to R9 is selected from at least one of an alkenyl group, a dienyl group, an alkinyl group or a diyne group.

Figure 7:
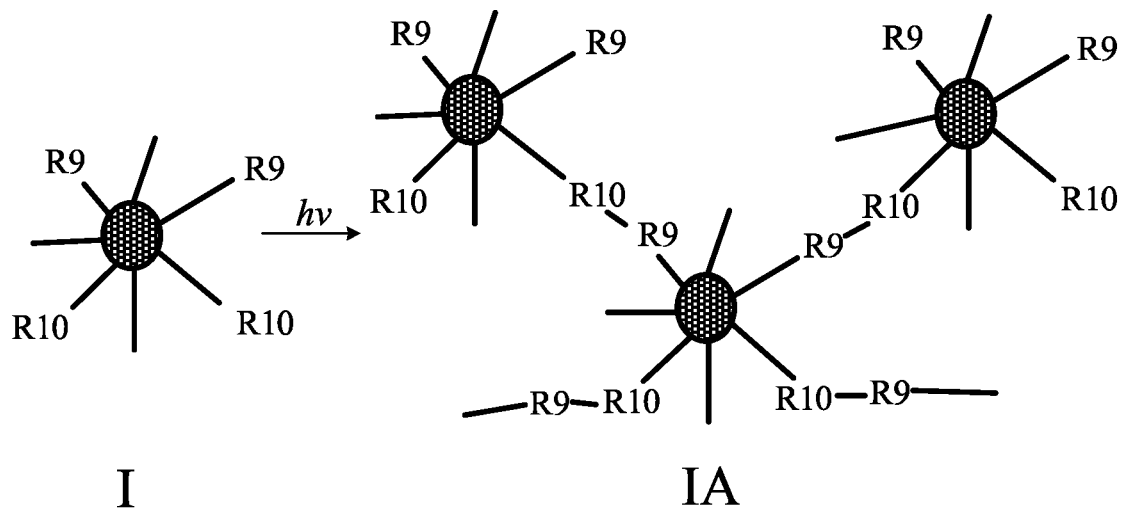
FIG. 7 is a schematic diagram of a cross-linking reaction of a cross-linkable quantum dot according to an embodiment of the disclosure.

For a cross-linkable quantum dot having a group pair R9 and R10 that can react to form a cross-linked network, FIG. 7 shows a schematic diagram of the principle of the cross-linking reaction of such quantum dot. In FIG. 7, Formula I represents the cross-linkable quantum dot having the group pair R9 and R10 that can react to form the cross-linked network. By the light irradiation (hv), a cross-linked network IA is formed between cross-linkable quantum dots.

In a specific implementation, in the above-mentioned light-emitting device provided by an embodiment of the disclosure, the cross-linked network may also be formed by cross-linking a cross-linking agent and a group R11, and the group R11 is a cross-linkable ligand before the cross-linked network is formed on the surface of the host quantum dot.

R11 is selected from at least one of a mercapto group, an alkenyl group and a dienyl group; and the cross-linking agent is selected from at least one of C4-C20 diene or C4-C20 diyne.

Figure 8:
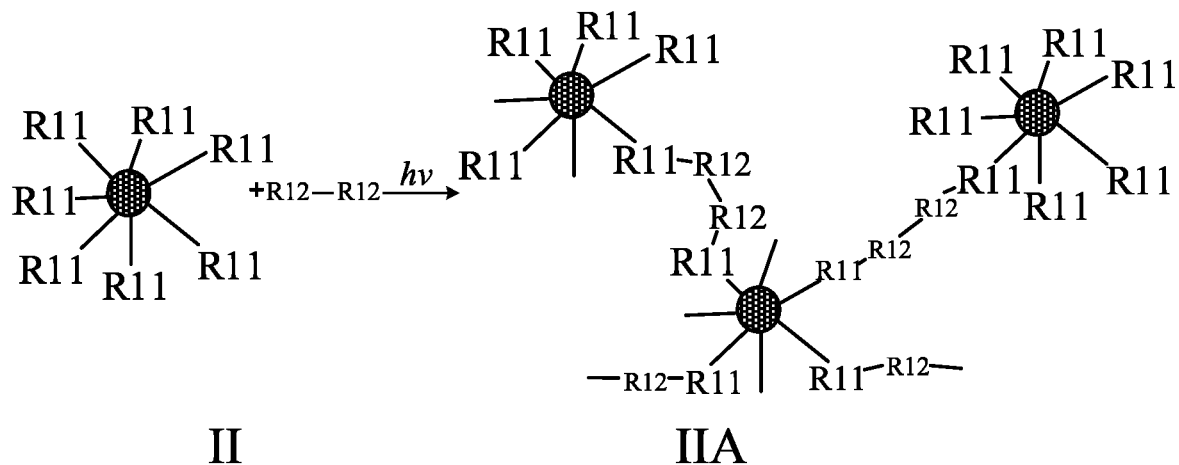
FIG. 8 is a schematic diagram of a cross-linking reaction of another cross-linkable quantum dot according to an embodiment of the disclosure.

For a cross-linkable quantum dot having a group R11 that can be cross-linked by the cross-linking agent to form a cross-linked network, FIG. 8 shows a schematic diagram of the principle of the cross-linking reaction of such quantum dot. In FIG. 8, Formula II represents the cross-linkable quantum dot having the group R11 that can be cross-linked by the cross-linking agent to form the cross-linked network, and R12-R12 is the cross-linking agent. By the light irradiation (hv), the cross-linkable quantum dot reacts with the cross-linking agent to form a cross-linked network IIA.

In a specific implementation, in the above-mentioned light-emitting device provided by an embodiment of the disclosure, as shown in FIGS. 1-6B, in the light-emitting layer of the sub-pixel including residual quantum dots, the light-emitting layer 3 of the red sub-pixel R has a red host quantum dot R-QD and two residual quantum dots, i.e., a green residual quantum dot 02 and a blue residual quantum dot 03; the light-emitting layer 3 of the green sub-pixel G has a green host quantum dot G-QD, a red residual quantum dot 01 and a blue residual quantum dot 03; and the light-emitting layer 3 of the blue sub-pixel B has a blue host quantum dot B-QD, a red residual quantum dot 01 and a green residual quantum dot 02. A molar ratio of the residual quantum dots (such as green residual quantum dot 02 and blue residual quantum dot 03) to all the quantum dots (including red host quantum dot R-QD, green residual quantum dot 02 and blue residual quantum dot 03) in each sub-pixel (such as red sub-pixel R) is less than 10%, the molar ratio of the residual quantum dots (such as red residual quantum dot 01 and blue residual quantum dot 03) to all the quantum dots (including green host quantum dot G-QD, red residual quantum dot 01 and blue residual quantum dot 03) in each sub-pixel (such as green sub-pixel G) is less than 10%, and the molar ratio of the residual quantum dots (such as red residual quantum dot 01 and green residual quantum dot 02) to all the quantum dots (including blue host quantum dot B-QD, red residual quantum dot 01 and green residual quantum dot 02) in each sub-pixel (such as blue sub-pixel B) is less than 10%.

In a specific embodiment, a particle size of the red quantum dot is the largest, the particle size of the green quantum dot is second large, and the particle size of the blue quantum dot is the smallest. In each step of photolithography patterning, the larger the particle size, the better the stability, so the red quantum dot is prepared first, followed by the green quantum dot, and the blue quantum dot is prepared last. The light-emitting devices are generally divided into an upright structure and an upside-down structure. In the upright structure, quantum dots are generally fabricated on a hole transport layer; and in the upside-down structure, the quantum dots are generally fabricated on an electron transport layer. Compared with the electron transport layer and the hole transport layer, the quantum dots are more likely to remain on other quantum dots, so the residual quantum dots in the red sub-pixel R are the most, followed by the residual quantum dots in the green sub-pixel G, and the residual quantum dots in the blue sub-pixel B are the least. In the above-mentioned light-emitting device provided by an embodiment of the disclosure, as shown in FIGS. 1-6B, in each sub-pixel, the molar ratio of residual quantum dots (including 02 and 03) to all quantum dots (including R-QD, 02 and 03) in the red sub-pixel R, the molar ratio of residual quantum dots (including 01 and 03) to all quantum dots (including G-QD, 01 and 03) in the green sub-pixel G, and the molar ratio of residual quantum dots (including 01 and 02) to all quantum dots (including B-QD, 01 and 02) in the blue sub-pixel B decrease sequentially.

Figure 5:
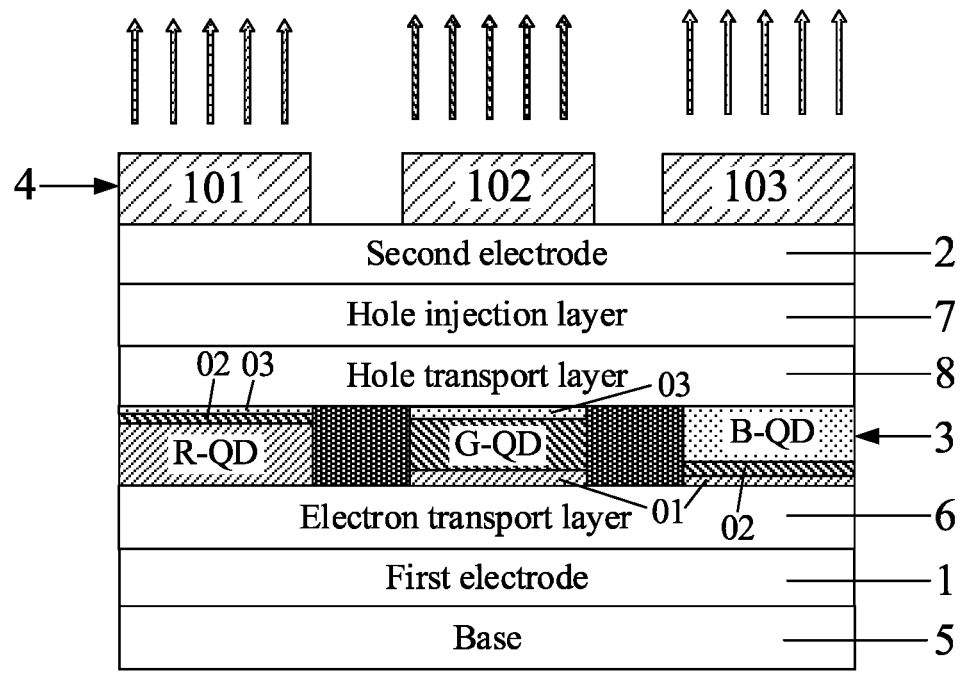
FIG. 5 is a schematic structural diagram of another light-emitting device according to an embodiment of the disclosure.

In a specific implementation, in the above-mentioned light-emitting device provided by an embodiment of the disclosure, as shown in FIG. 5, the color filter layer 4 may include a plurality of color resists (101, 102, 103) of different colors in one-to-one correspondence with sub-pixels (R, G, B) emitting light of different colors. The color filter layer 4 may include: a red color resist 101 corresponding to the red sub-pixel R, a green color resist 102 corresponding to the green sub-pixel G, and a blue color resist 103 corresponding to the blue sub-pixel B. The red color resist 101 allows red light to pass through and prevents green light and blue light from passing through, thereby solving the problem of color mixing in the red sub-pixel R; the green color resist 102 allows the green light to pass through and prevents the red light and blue light from passing through, thereby solving the problem of color mixing in the green sub-pixel G; and the blue color-resistor 103 only allows the blue light to pass through and prevents the green light and red light from passing through, thereby solving the problem of color mixing in the blue sub-pixel B.

A material of the color resist may be a color resin material, and optionally, the material of the color resist is a mixture of a propionate polymer and a pigment. For example, the red color resist is formed by adding a red pigment to resin, the green color resist is formed by adding a green pigment to resin, and the blue color resist is formed by adding a blue pigment to resin.

Figure 6A:
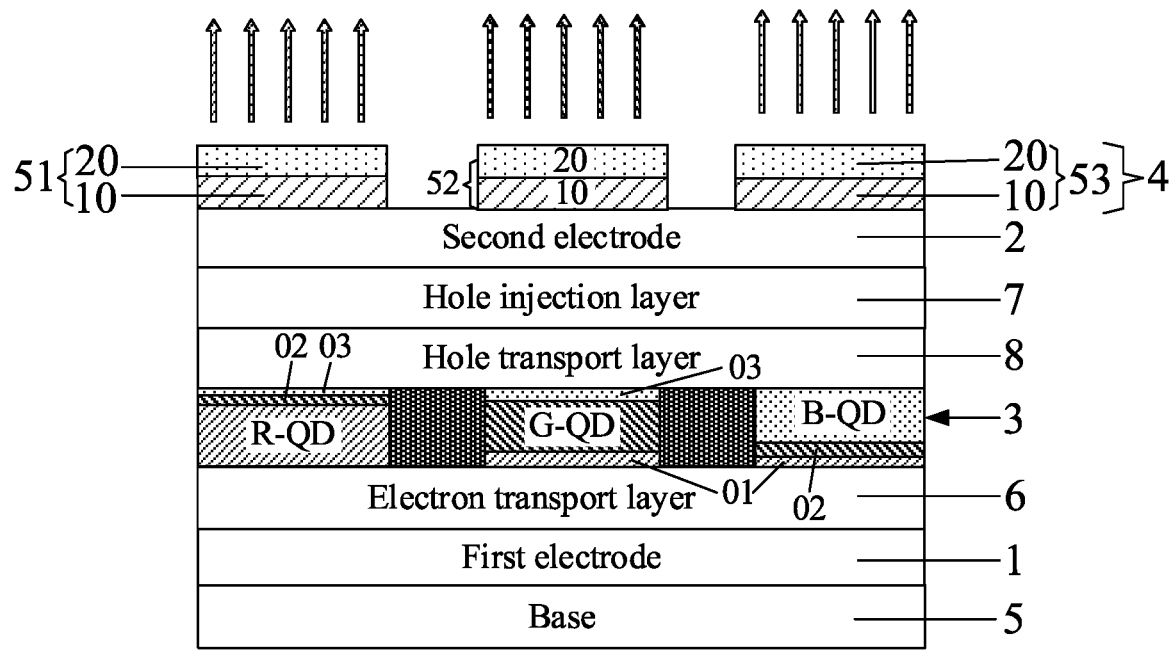
FIG. 6A is a schematic structural diagram of another light-emitting device according to an embodiment of the disclosure.

In a specific implementation, in the above-mentioned light-emitting device provided by an embodiment of the disclosure, as shown in FIG. 6A, the color filter layer 4 includes a plurality of optical modulation parts (51, 52, 53) corresponding to the sub-pixels (R, G, B), and each sub-pixel corresponds to one optical modulation part.

An optical modulation part 51 corresponding to the red sub-pixel R is a first long-pass filter, a starting wavelength of the first long-pass filter is less than a wavelength corresponding to a luminous peak of the red host quantum dot R-QD and greater than a wavelength corresponding to a luminous peak of the green host quantum dot G-QD; an optical modulation part 53 corresponding to the blue sub-pixel B is a short-pass filter, a cut-off wavelength of the short-pass filter is less than the wavelength corresponding to the luminous peak of the green host quantum dot G-QD and greater than a wavelength corresponding to a luminous peak of the blue host quantum dot B-QD; and an optical modulation part 52 corresponding to the green sub-pixel B is a second long-pass filter, a starting wavelength of the second long-pass filter is less than the wavelength corresponding to the luminous peak of the green host quantum dot G-QD and greater than the wavelength corresponding to the luminous peak of the blue host quantum dot B-QD.

The starting wavelength of the long-pass filter refers to a corresponding wavelength when the transmittance increases to ½ of the peak value in the long-pass filter; and the cut-off wavelength of the short-pass filter refers to a corresponding wavelength when the transmittance decreases to ½ of the peak value in the short-pass filter.

The starting wavelength of the first long-pass filter is less than the wavelength corresponding to the luminous peak of the red host quantum dot and greater than the wavelength corresponding to the luminous peak of the green host quantum dot, which is beneficial for the light emitted by the red quantum dot to pass through the color filter layer while preventing the light emitted by the green quantum dot and the light emitted by the blue quantum dot from passing through the color filter layer, to increase the light purity of the red sub-pixel R. The cut-off wavelength of the short-pass filter is less than the wavelength corresponding to the luminous peak of the green host quantum dot and greater than the wavelength corresponding to the luminous peak of the blue host quantum dot, which is beneficial for the light emitted by the blue quantum dot to pass through the color filter layer while preventing the light emitted by the green quantum dot and the light emitted by the red quantum dot from passing through the color filter layer, to increase the light purity of the blue sub-pixel B. The starting wavelength of the second long-pass filter is less than the wavelength corresponding to the luminous peak of the green host quantum dot and greater than the wavelength corresponding to the luminous peak of the blue host quantum dot, which is beneficial for the light emitted by the green quantum dot to pass through the color filter layer while preventing the light emitted by the blue quantum dot from passing through the color filter layer. The second long-pass filter can also make the light emitted by the red residual quantum dot pass through the color filter layer. However, according to the specific embodiment, the residual amount of red residual quantum dots can be relatively less than that of blue residual quantum dots, and the light emitted through the red residual quantum dots has little influence on the color purity of the green light-emitting device, so the optical modulation part 52 can be designed as a second long-pass filter to ensure the color gamut of the light-emitting device.

Optionally, the optical modulation part 51 corresponding to the red sub-pixel R is a first long-pass filter, a starting wavelength of the first long-pass filter is less than or equal to the minimum value of the luminous waveband of the red host quantum dot R-QD and greater than or equal to the maximum value of the luminous waveband of the green host quantum dot G-QD; the optical modulation part 53 corresponding to the blue sub-pixel B is a short-pass filter, a cut-off wavelength of the short-pass filter is less than or equal to the minimum value of the luminous waveband of the green host quantum dot G-QD and greater than or equal to the maximum value of the luminous waveband of the blue host quantum dot B-QD; and the optical modulation part 52 corresponding to the green sub-pixel G is a second long-pass filter, a starting wavelength of the second long-pass filter is less than or equal to the minimum value of the luminous waveband of the green host quantum dot G-QD and greater than or equal to the maximum value of the luminous waveband of the blue host quantum dot B-QD.

The luminous waveband of the quantum dot may be understood as a waveband corresponding to wavelengths with the luminous intensity greater than or equal to 20% of the luminous peak value of the quantum dot.

In a specific embodiment, the starting wavelength of the first long-pass filter is less than or equal to 610 nm and greater than or equal to 540 nm; the cut-off wavelength of the short-pass filter is less than or equal to 510 nm and greater than or equal to 460 nm; and the starting wavelength of the second long-pass filter is less than or equal to 510 nm and greater than or equal to 460 nm.

It should be noted that the above-mentioned first long-pass filter, short-pass filter and second long-pass filter may be adjusted and designed to realize respective corresponding functions.

Figure 6B:
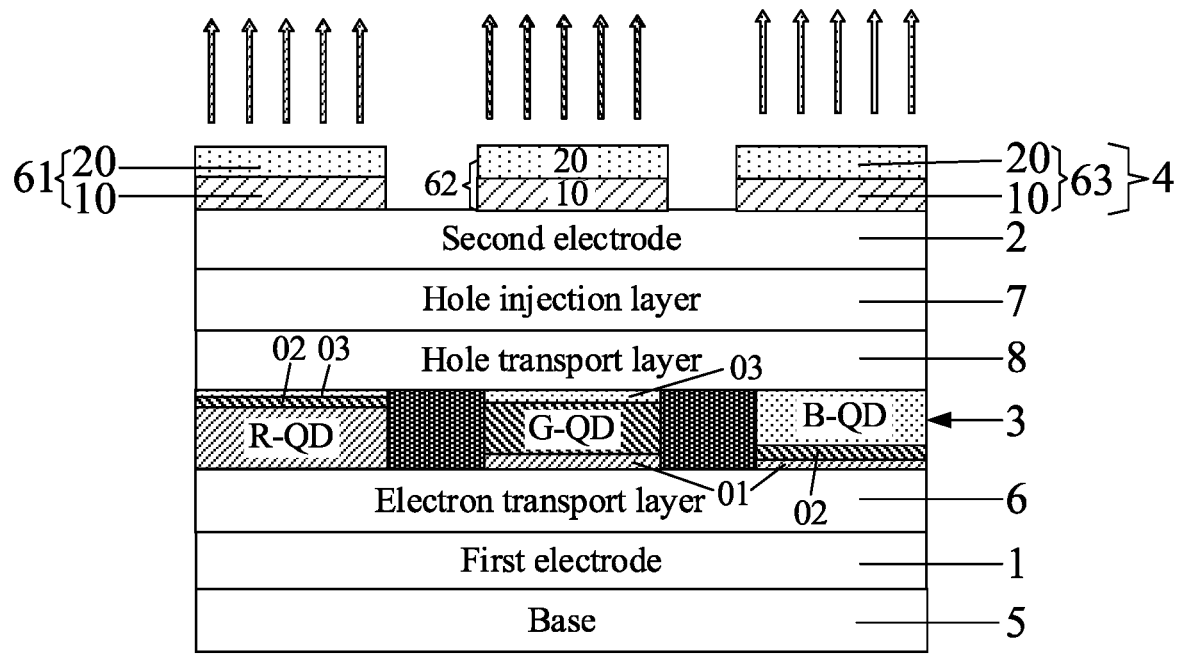
FIG. 6B is a schematic structural diagram of another light-emitting device according to an embodiment of the disclosure.

In a specific implementation, in the above-mentioned light-emitting device provided by an embodiment of the disclosure, as shown in FIG. 6B, the color filter layer 4 includes a plurality of optical modulation parts (61, 62, 63) corresponding to the sub-pixels (R, G, B), and each sub-pixel corresponds to one optical modulation part.

An optical modulation part 61 corresponding to the red sub-pixel R is a first band-pass filter, a starting wavelength of the first band-pass filter is less than a wavelength corresponding to a luminous peak of the red host quantum dot R-QD and greater than a wavelength corresponding to a luminous peak of the green host quantum dot G-QD, and a cut-off wavelength of the first band-pass filter is greater than the wavelength corresponding to the luminous peak of the red host quantum dot R-QD.

An optical modulation part 62 corresponding to the green sub-pixel G is a second band-pass filter, a starting wavelength of the second band-pass filter is less than the wavelength corresponding to the luminous peak of the green host quantum dot G-QD and greater than a wavelength corresponding to a luminous peak of the blue host quantum dot B-QD, and a cut-off wavelength of the second band-pass filter is greater than the wavelength corresponding to the luminous peak of the green host quantum dot G-QD and less than the wavelength corresponding to the luminous peak of the red host quantum dot R-QD.

An optical modulation part 63 corresponding to the blue sub-pixel is a third band-pass filter, a starting wavelength of the third band-pass is less than the wavelength corresponding to the luminous peak of the blue host quantum dot B-QD, and a cut-off wavelength of the third band-pass is greater than the wavelength corresponding to the luminous peak of the blue host quantum dot B-QD and less than the wavelength corresponding to the luminous peak of the green host quantum dot G-QD.

The starting wavelength of the band-pass filter refers to a corresponding wavelength when the transmittance increases to ½ of the peak value in the band-pass filter; and the cut-off wavelength of the band-pass filter refers to a corresponding wavelength when the transmittance decreases to ½ of the peak value in the band-pass filter.

It can be understood that the first optical modulation part 61, the second optical modulation part 62 and the third optical modulation part 63 can increase light purities of the red sub-pixel R, the green sub-pixel G and the blue sub-pixel B respectively.

Optionally, the starting wavelength of the first band-pass filter is less than or equal to the minimum value of the luminous waveband of the red host quantum dot R-QD and greater than or equal to the maximum value of the luminous waveband of the green host quantum dot G-QD; and the cut-off wavelength of the first band-pass filter is greater than or equal to the maximum value of the luminous waveband of the red host quantum dot R-QD.

The optical modulation part 62 corresponding to the green sub-pixel G is a second band-pass filter, a starting wavelength of the second band-pass filter is less than or equal to the minimum value of the luminous waveband of the green host quantum dot G-QD and greater than or equal to the maximum value of the luminous waveband of the blue host quantum dot G-QD, and a cut-off wavelength of the second band-pass filter is greater than or equal to the maximum value of the luminous waveband of the green host quantum dot G-QD and less than or equal to the minimum value of the luminous waveband of the red host quantum dot R-QD.

The optical modulation part 63 corresponding to the blue sub-pixel B is a third band-pass filter, a starting wavelength of the third band-pass is less than or equal to the minimum value of the luminous waveband of the blue host quantum dot B-QD, and a cut-off wavelength of the third band-pass is greater than or equal to the maximum value of the luminous waveband of the blue host quantum dot B-QD and less than or equal to the minimum value of the luminous waveband of the green host quantum dot G-QD.

In a specific embodiment, the starting wavelength of the first band-pass filter is less than or equal to 610 nm, and the cut-off wavelength is greater than or equal to 640 nm; the starting wavelength of the second band-pass filter is less than or equal to 510 nm, and the cut-off wavelength is greater than or equal to 640 nm; and the starting wavelength of the third band-pass filter is less than or equal to 420 nm, and the cut-off wavelength is greater than or equal to 460 nm.

It should be noted that the above-mentioned first band-pass filter, second band-pass filter and third band-pass filter may be adjusted and designed to realize respective corresponding functions.

In some embodiments, in the above-mentioned light-emitting device provided by an embodiment of the disclosure, the color filter layer 4 includes a plurality of optical modulation parts corresponding to the sub-pixels, and each sub-pixel corresponds to n−1 optical modulation parts stacked to prevent the light emitted by the residual quantum dots from passing through. As shown in FIGS. 1-4, embodiments of the disclosure take each pixel unit including three sub-pixels of red, green and blue as an example, where each sub-pixel correspondingly includes two optical modulation parts stacked. For example: the red sub-pixel R correspondingly includes a first optical modulation part 41 that prevents the light emitted by the green residual quantum dot 02 from passing through and a second optical modulation part 42 that prevents the light emitted by the blue residual quantum dot 03 from passing through; the green sub-pixel G correspondingly includes a third optical modulation part 43 that prevents the light emitted by the red residual quantum dot 01 from passing through and a second optical modulation part 42 that prevents the light emitted by the blue residual quantum dot 03 from passing through; and the blue sub-pixel B correspondingly includes a third optical modulation part 43 that prevents the light emitted by the red residual quantum dot 01 from passing through and a first optical modulation part 41 that prevents the light emitted by the green residual quantum dot 02 from passing through.

The optical modulation part shown in FIGS. 1-6B may be a Distributed Bragg Reflector (DBR). By arranging the distributed Bragg reflector (DBR) and by designing the distributed Bragg reflector, control of the light output band is realized. The color filter layer in an embodiment of the disclosure may be a plurality of distributed Bragg reflectors, so that each sub-pixel only emits light of a certain color. For example, a distributed Bragg reflector corresponding to the red sub-pixel R is designed, so that this distributed Bragg reflector emits the red light and prevents the light emitted by the green residual quantum dot 02 and the light emitted by the blue residual quantum dot 03 from exiting, thereby solving the problem of color mixing of the red sub-pixel R. Similarly, by designing a distributed Bragg reflector corresponding to the green sub-pixel G and a distributed Bragg reflector corresponding to the blue sub-pixel B, the problem of color mixing of the green sub-pixel G and the blue sub-pixel B can be solved.

Figure 2:
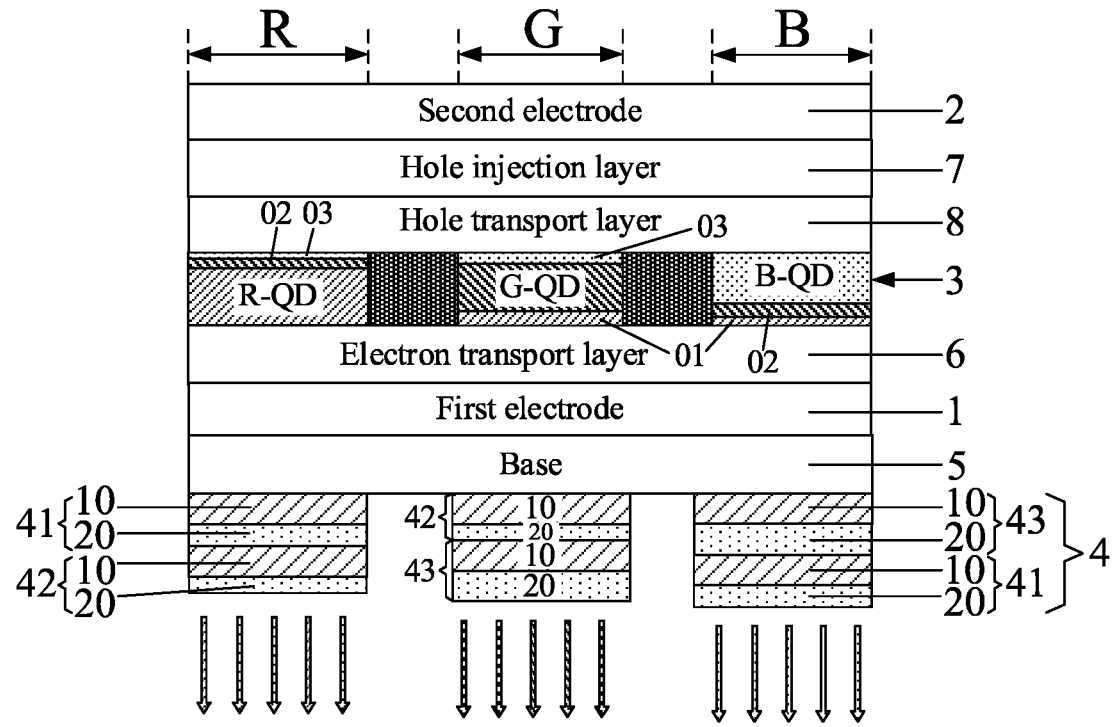
FIG. 2 is a schematic structural diagram of another light-emitting device according to an embodiment of the disclosure.

In a specific implementation, the above-mentioned light-emitting device provided by an embodiment of the disclosure, as shown in FIG. 1 and FIG. 2, further includes a base 5 located on a side of the first electrode 1 away from the second electrode 2. The first electrode 1 is a transparent electrode, the second electrode 2 is a reflective electrode, and the optical modulation parts are located on a side of the first electrode 1 away from the second electrode 2. That is, the light output mode of the light-emitting device shown in FIG. 1 and FIG. 2 is light output from bottom.

In a specific implementation, the above-mentioned light-emitting device provided by an embodiment of the disclosure, as shown in FIG. 3, FIG. 4, FIG. 6A and FIG. 6B, further includes a base 5 located on a side of the first electrode 1 away from the second electrode 2. The first electrode 1 is a reflective electrode, the second electrode 2 partially transmits and partially reflects light in a visible light band, and the optical modulation parts are located on a side of the second electrode 2 away from the first electrode 1. That is, the light output mode of the light-emitting device shown in FIG. 3, FIG. 4, FIG. 6A and FIG. 6B is light output from top. In a specific implementation, the above-mentioned light-emitting device provided by an embodiment of the disclosure, as shown in FIG. 2, FIG. 4 to FIG. 6B, further includes: an electron transport layer 6 between the first electrode 1 and the light-emitting layer 3, a hole injection layer 7 between the light-emitting layer 3 and the second electrode 2, and a hole transport layer 8 between the hole injection layer 7 and the light-emitting layer 3, that is, the light-emitting device shown in FIG. 2, FIG. 4 to FIG. 6B is an upside-down structure; where a material of the electron transport layer 6 includes an inorganic electron transport material.

Figure 3:
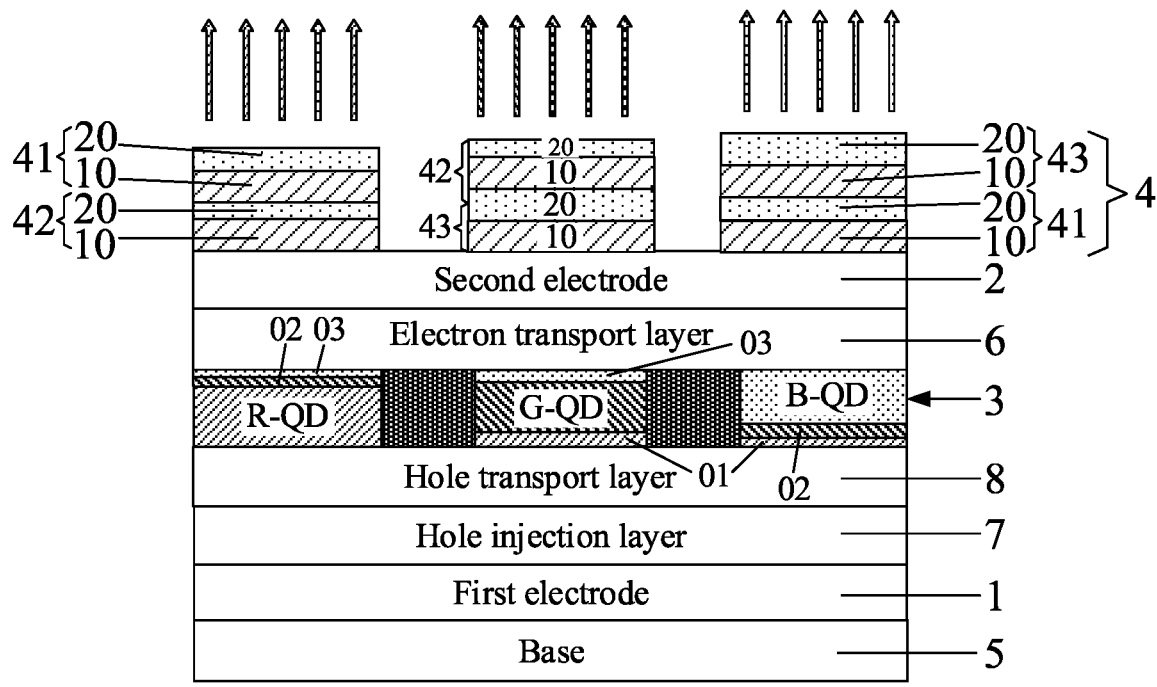
FIG. 3 is a schematic structural diagram of another light-emitting device according to an embodiment of the disclosure.

Alternatively, as shown in FIG. 1 and FIG. 3, the above-mentioned light-emitting device further includes: a hole transport layer 8 between the first electrode 1 and the light-emitting layer 3, a hole injection layer 7 between the first electrode 1 and the hole transport layer 8, and an electron transport layer 6 between the light-emitting layer 3 and the second electrode 2, that is, the light-emitting device shown in FIG. 1 and FIG. 3 is an upright structure; where the hole transport layer 8 includes an inorganic hole transport material.

The above-mentioned inorganic electron transport material includes but not limited to at least one of zinc oxide, magnesium zinc oxide, aluminum zinc oxide, lithium zinc oxide, titanium oxide, or aluminum oxide; and the above-mentioned inorganic hole transport material includes but not limited to at least one of nickel oxide, tungsten oxide, cuprous oxide, or molybdenum oxide.

It should be noted that FIG. 5, FIG. 6A and FIG. 6B in the disclosure are illustrated by taking an upside-down top emitting structure as an example. Of course, an upside-down bottom emitting structure, upright top emitting structure or upright bottom emitting structure may also be possible, which is not limited here.

In a specific implementation, in the above-mentioned light-emitting device provided by an embodiment of the disclosure, the material of the host quantum dot in the light-emitting layer includes but not limited to at least one of CdS, CdSe, CdTe, ZnSe, InP, PbS, CuInS2, ZnO, CsPbCl3, CsPbBr3, CsPbI3, CdS/ZnS, CdSe/ZnS, ZnSe, InP/ZnS, PbS/ZnS, InAs, InGaAs, InGaN, GaNk, ZnTe, Si, Ge, C, nanorod. Optionally, an embodiment of the disclosure uses the cadmium-free and lead-free quantum dot material to achieve no pollution to the environment.

In a specific implementation, the above-mentioned light-emitting device provided by an embodiment of the disclosure, as shown in FIGS. 1-4, 6A and 6B, each optical modulation part (41, 42, 43, 51, 52, 53, 61, 62, 63) may include at least one first film layer 10 and at least one second film layer 20 alternately stacked; and a refractive index of the first film layer 10 is different from a refractive index of the second film layer 20.

According to an embodiment of the disclosure, as shown in FIGS. 1-4, 6A and 6B, the optical modulation part (41, 42, 43, 51, 52, 53, 61, 62, 63) may be a periodic structure including two kinds of materials with different refractive indexes arranged alternately in an ABAB manner, and Fresnel reflection occurs at each interface of the two kinds of materials. By adjusting the number of periods of the Bragg reflector and the thickness of each film layer, the result of strong reflection of the light with certain specific wavelengths can be achieved. In a specific implementation, since the Fresnel reflection occurs at each interface of the first film layer and the second film layer in a reflection unit, all the reflected light at the interface undergoes destructive interference, resulting in strong reflection. Reflectivity is determined by the number of layers of materials and the difference in refractive index between materials. Therefore, the target reflectivity of the light in different wavebands can be obtained as required by changing the refractive index and thickness of the material. In a possible implementation, in the above-mentioned light-emitting device provided by an embodiment of the disclosure, as shown in FIGS. 1-4, materials of first film layers 10 in the optical modulation parts (41, 42, 43) that reflect light of different colors are the same, and materials of second film layers 20 in the optical modulation parts (41, 42, 43) that reflect light of different colors are the same. The thickness of the first film layer 10 is fixed. Since the red light has the longest wavelength and the blue light has the shortest wavelength, the red light needs to travel a longer optical path to achieve the effect of cancellation. Therefore, the thickness of the second film layer 20 in the third optical modulation part 43 reflecting the red light, the thickness of the second film layer 20 in the first optical modulation part 41 reflecting the green light, and the thickness of the second film layer 20 in the second optical modulation part 42 reflecting the blue light decrease sequentially, so that the optical modulation parts reflect the light of different colors.

In another possible implementation, in the above-mentioned light-emitting device provided by an embodiment of the disclosure, as shown in FIGS. 1-4, the materials of the first film layers 10 in the optical modulation parts (41, 42, 43) that reflect light of different colors are the same, and the materials of the second film layers 20 in the optical modulation parts (41, 42, 43) that reflect light of different colors are the same. The thickness of the second film layer 20 is fixed. The thickness of the first film layer 10 in the third optical modulation part 43 reflecting the red light, the thickness of the first film layer 10 in the first optical modulation part 41 reflecting the green light, and the thickness of the first film layer 10 in the second optical modulation part 42 reflecting the blue light decrease sequentially, so that the optical modulation parts reflect the light of different colors.

It should be noted that the above-mentioned light-emitting device provided by embodiments of the disclosure is illustrated by taking the case where the materials of the first film layers 10 are the same and the materials of the second film layers 20 are the same in the optical modulation parts (41, 42, 43) and the thickness of one of the first film layer 10 and the second film layer 20 is changed so that the optical modulation parts reflect the light of different colors as an example. Of course, in a specific implementation, it is also possible to fix the same thickness of the first film layers 10 and the same thickness of the second film layers 20 in the optical modulation parts (41, 42, 43), and change the material of at least one of the first film layer 10 and the second film layer 20 so that the optical modulation parts reflect the light of different colors.

In a specific implementation, in the above-mentioned light-emitting device provided by an embodiment of the disclosure, as shown in FIGS. 1 to 4, a material of the first film layer 10 includes but not limited to InGaAsP, InAlGaN, $SiO_2$, $TiO_2$, $Si_3N_4$, Au or Ag; a material of the second film layer 20 includes but not limited to InGaAsP, InAlGaN, $SiO_2$, $TiO_2$, $Si_3N_4$, Au or Ag; and the material of the first film layer 10 is different from the material of the second film layer 20.

In a specific implementation, in the light-emitting device provided by an embodiment of the disclosure, as shown in FIGS. 1-4, the thickness of the first film layer 10 and the thickness of the second film layer 20 may both be 1 nm to 200 nm.

The specific thicknesses of the first film layer 10 and the second film layer 20 are designed according to the device structure, to achieve the optimal light extraction efficiency of the device.

In some embodiments, in a light-emitting device with an upright top emitting structure, the first electrode is a reflective electrode, the second electrode partially transmits and partially reflects the light in the visible light band, and the optical modulation parts are located at the side of the second electrode away from the first electrode; the material of the first film layer and the material of the second film layer are fixed, and the thicknesses of the first film layer and the second film layer corresponding to the optimal light extraction efficiency of the light-emitting device are obtained respectively when the colors of the light emitted by the host quantum dots in the light-emitting layer are blue, red and green.

Figure 9:
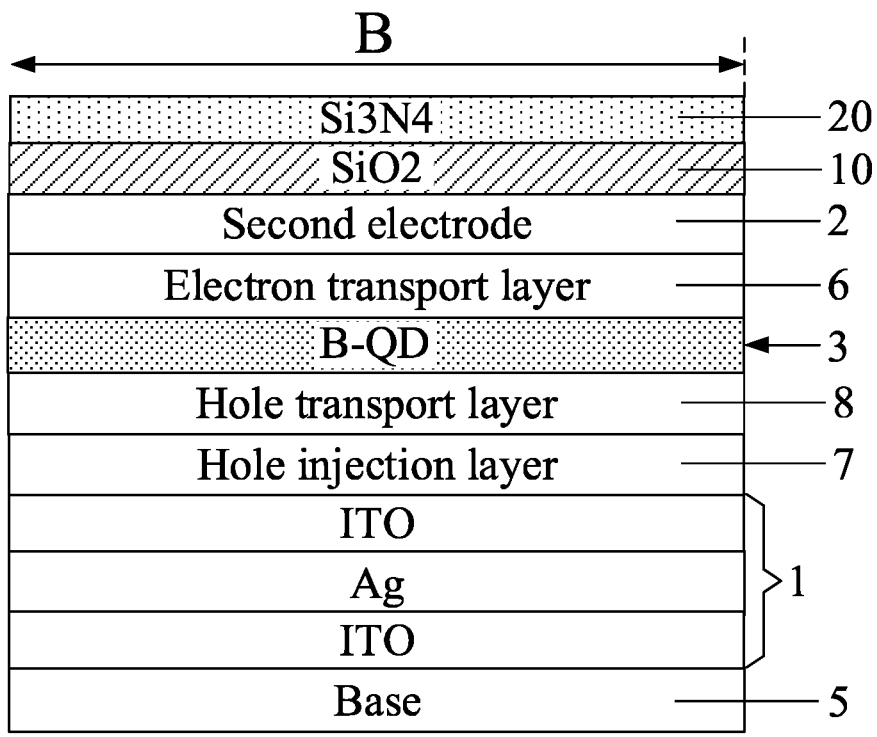
FIG. 9 is a schematic structural diagram of a blue light-emitting device according to an embodiment of the disclosure.
Figure 10:
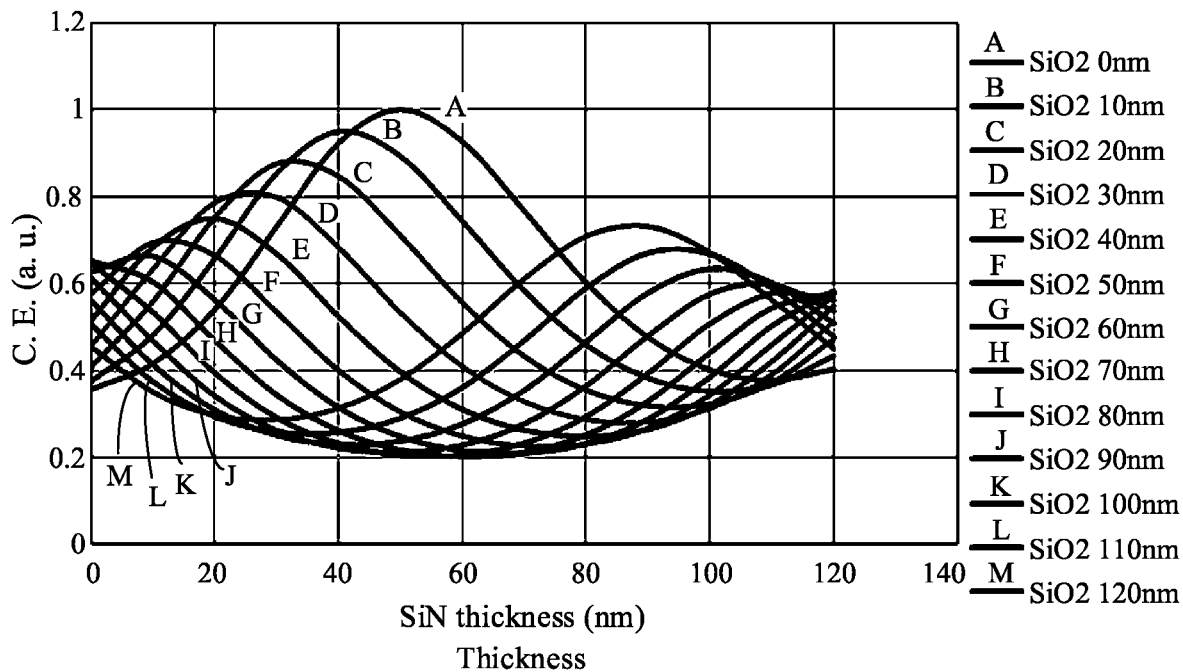
FIG. 10 is a schematic diagram of the influence of thicknesses of the first film layer and the second film layer corresponding to FIG. 9 on the device efficiency.
Figure 11:
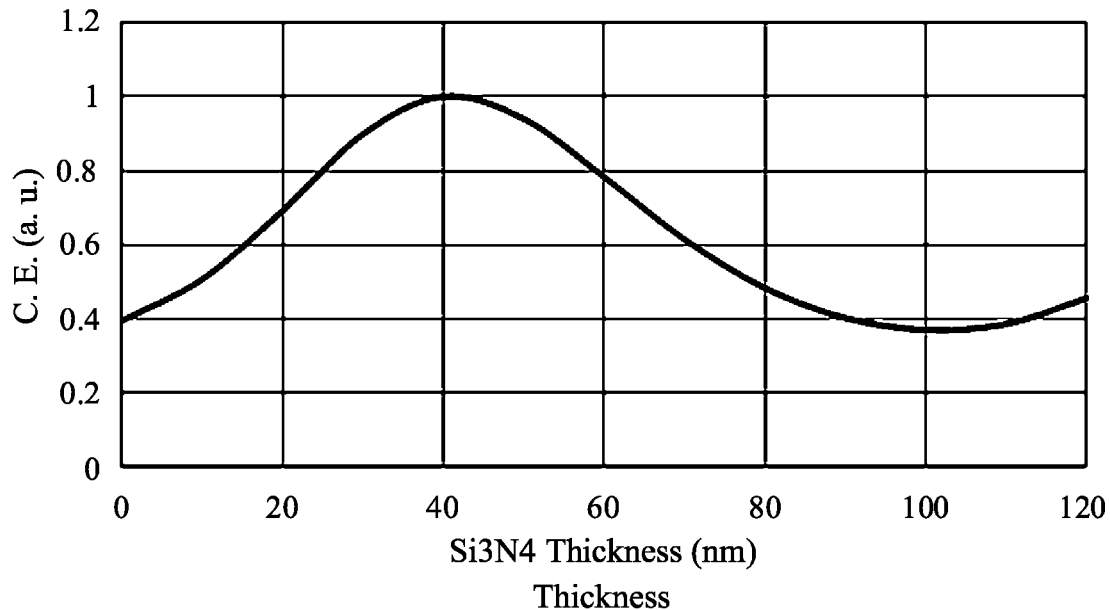
FIG. 11 is a schematic diagram of the influence of the change of the thickness of the second film layer on the device efficiency under the fixed thickness of the first film layer.

As shown in FIG. 9, the first electrode 1 uses ITO/Ag/ITO stacked, and the second electrode 2 uses Ag. The Ag in the first electrode 1 is thicker for reflection, and the Ag in the second electrode 2 is thinner (about 8 nm) for light transmission. A material of the hole injection layer 6 is PEDOT, a material of the hole transport layer 7 is TFB, a material of the electron transport layer 5 is ZnO, the color of the light emitted by the host quantum dot in the light-emitting layer 3 is blue (i.e., blue host quantum dot B-QD), the material of the first film layer 10 closest to the second electrode 2 is $SiO_2$, and the material of the second film layer closest to the second electrode 2 is $Si_3N_4$. As shown in FIG. 10, FIG. 10 is a graph of the influence of the thickness changes of $SiO_2$ and $Si_3N_4$ on the efficiency of the light-emitting device shown in FIG. 9. It can be seen that the efficiency of the light-emitting device is better when the thickness of $SiO_2$ is 5 nm to 15 nm. As shown in FIG. 11, FIG. 11 shows the influence of the change in thickness of $Si_3N_4$ on the device efficiency when the thickness of $SiO_2$ is fixed at 10 nm. It can be seen that the device has better efficiency when the thickness of $SiO_2$ is 10 nm and the thickness of $Si_3N_4$ is 35 nm to 45 nm. Thus, in a possible implementation, the thickness of the first film layer 10 is 5 nm to 15 nm and the thickness of the second film layer 20 is approximately 35 nm to 45 nm in the blue light-emitting device provided by an embodiment of the disclosure.

Figure 12:
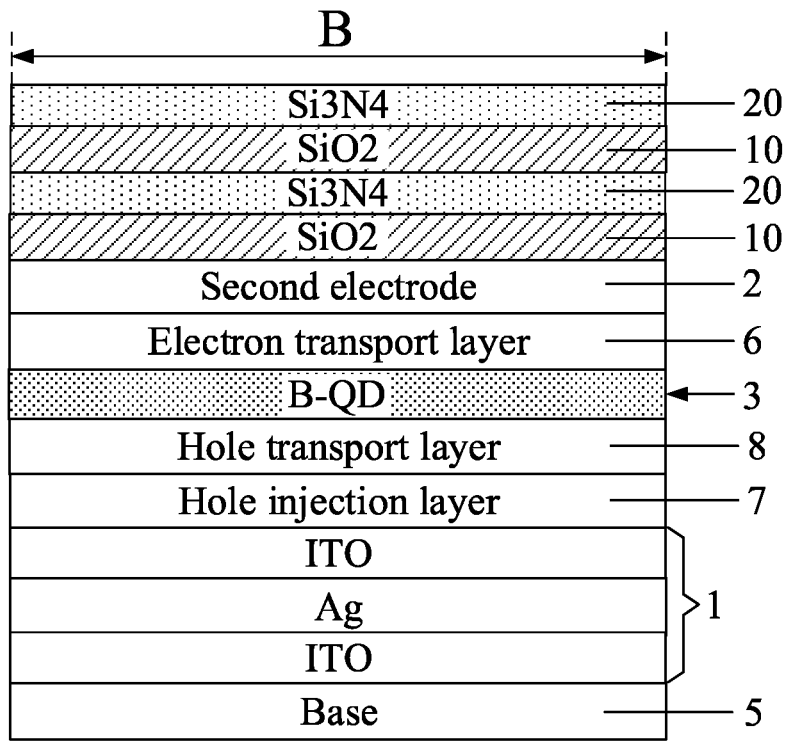
FIG. 12 is a schematic structural diagram of another blue light-emitting device according to an embodiment of the disclosure.
Figure 13:
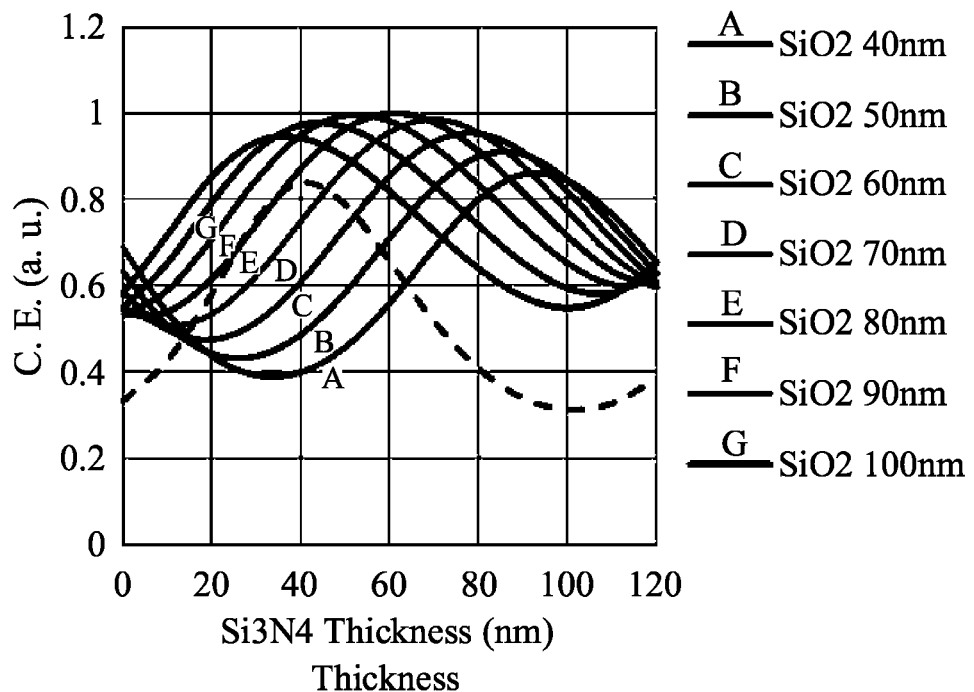
FIG. 13 is a schematic diagram of the influence of the thicknesses of the first film layer and the second film layer away from the second electrode in FIG. 12 on the device efficiency.

FIG. 9 is an example including only one first film layer and one second film layer. As can be seen from the above, the strong reflection of certain specific wavelengths can be achieved by adjusting the number of the first film layers and the second film layers to improve the efficiency of the light-emitting device. As shown in FIG. 12, one first film layer 10 and one second film layer 20 are further added on the basis of FIG. 9, that is, a double-layer optical modulation part is used in FIG. 12, where the thickness of the first film layer 10 (SiO2) closest to the second electrode 2 is fixed at 10 nm, the thickness of the second film layer 20 (Si3N4) closest to the second electrode 2 is fixed at 40 nm, and the thicknesses of the first film layer 10 (SiO2) and the second film layer 20 (Si3N4) away from the second electrode 2 are changed to affect the efficiency of the light-emitting device. As shown in FIG. 13, the dotted curve in FIG. 13 represents the efficiency change of the device in the case of one first film layer 10 and one second film layer 20 in FIG. 11, and other solid curves represent the influence of the thickness change of the added first film layer 10 and second film layer 20 on the device efficiency in the case of adding one first film layer 10 and one second film layer 20 on the basis of FIG. 9. It can be seen that the double-layer distributed Bragg reflector further improves the device efficiency compared with the single-layer distributed Bragg reflector shown in FIG. 9.

It should be noted that FIG. 9 and FIG. 12 study the influence on the efficiency of the light-emitting device respectively by taking the single-layer and double-layer optical modulation parts as examples. Of course, in a specific implementation, the alternate structure with more first film layers and second film layers may be designed to improve the light extraction efficiency of the light-emitting device, which is not described in embodiments of the disclosure.

Figure 14:
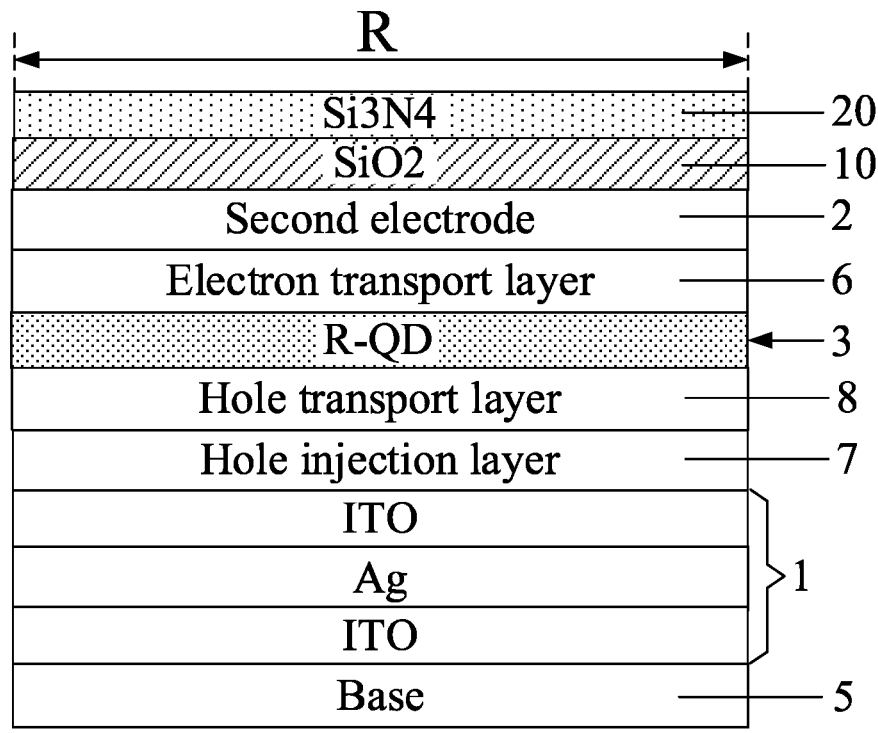
FIG. 14 is a schematic structural diagram of a red light-emitting device according to an embodiment of the disclosure.
Figure 15:
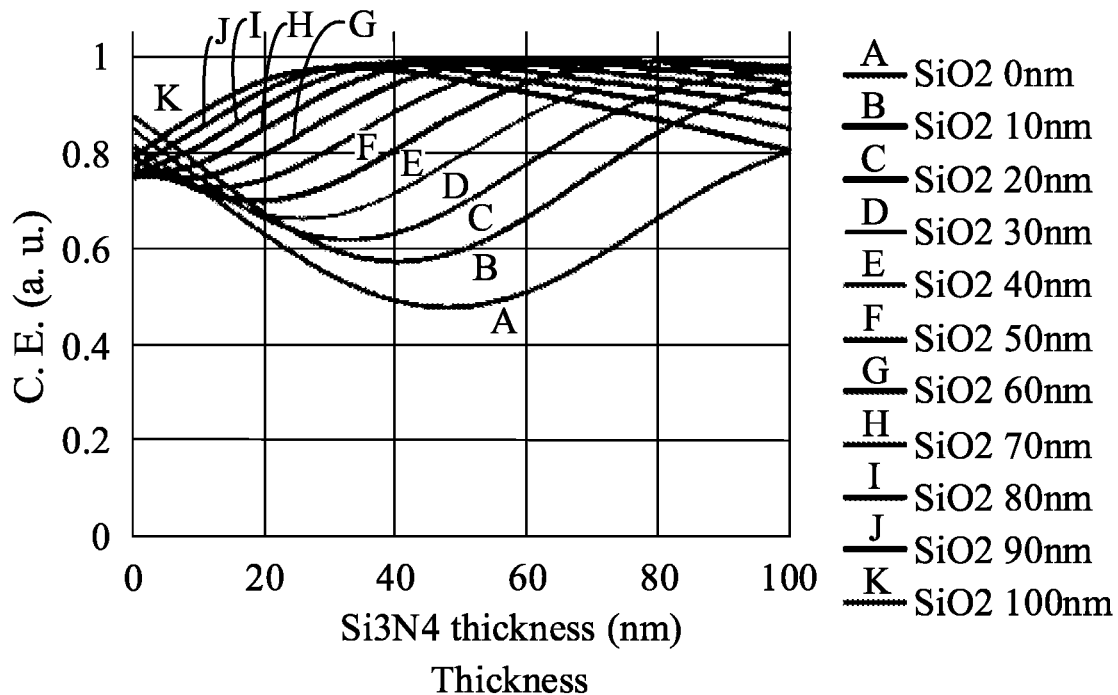
FIG. 15 is a schematic diagram of the influence of the thicknesses of the first film layer and the second film layer corresponding to FIG. 14 on the device efficiency.

As shown in FIG. 14, the first electrode 1 uses ITO/Ag/ITO stacked, and the second electrode 2 uses Ag. The Ag in the first electrode 1 is thicker for reflection, and the Ag in the second electrode 2 is thinner (about 8 nm) for light transmission. The material of the hole injection layer 6 is PEDOT, the material of the hole transport layer 7 is TFB, the material of the electron transport layer 5 is ZnO, the color of the light emitted by the host quantum dot in the light-emitting layer 3 is red (i.e., red host quantum dot R-QD), the material of the first film layer 10 is SiO2, and the material of the second film layer is Si3N4. As shown in FIG. 15, FIG. 15 is a graph of the influence of the thickness changes of SiO2 and Si3N4 on the efficiency of the light-emitting device shown in FIG. 14. It can be seen that the efficiency of the light-emitting device is better when the thickness of SiO2 is 55 nm to 65 nm and the thickness of Si3N4 is 55 nm to 65 nm. Therefore, in a possible implementation, the thickness of the first film layer 10 is 55 nm to 65 nm and the thickness of the second film layer 20 is approximately 55 nm to 65 nm in the red light-emitting device provided by an embodiment of the disclosure. Therefore, the efficiency of the red upright top-emitting structure device can be effectively improved through the reasonable design of the distributed Bragg reflector.

Figure 16:
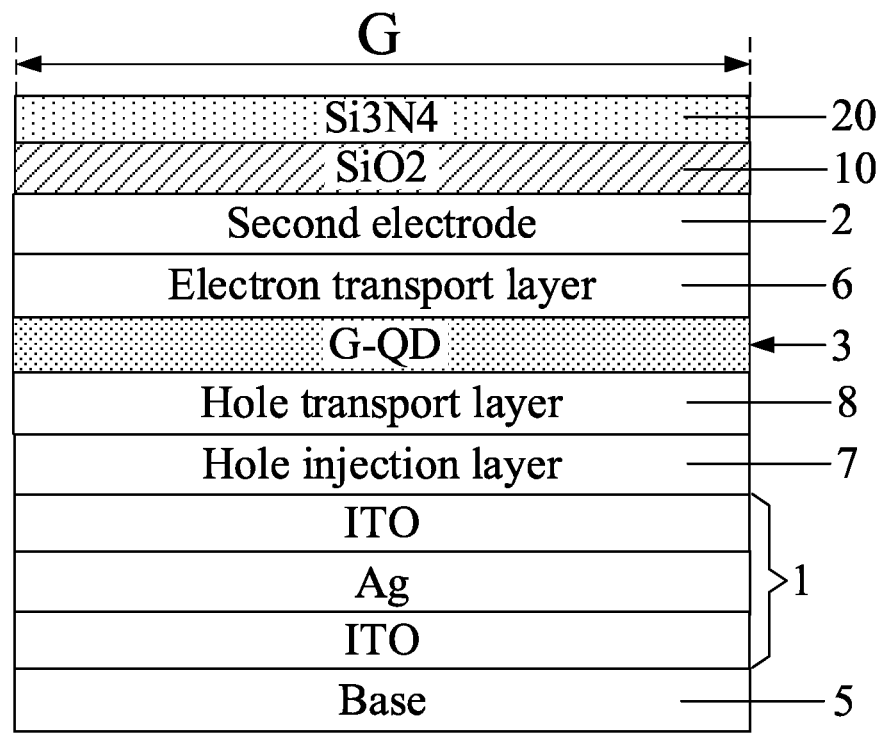
FIG. 16 is a schematic structural diagram of a green light-emitting device according to an embodiment of the disclosure.
Figure 17:
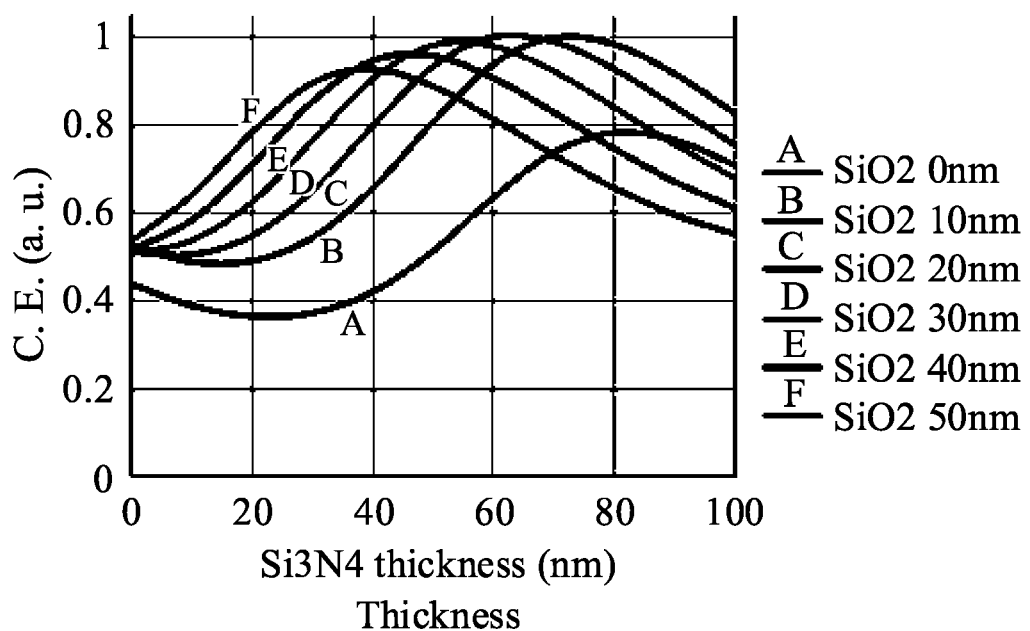
FIG. 17 is a schematic diagram of the influence of the thicknesses of the first film layer and the second film layer corresponding to FIG. 16 on the device efficiency.

As shown in FIG. 16, the first electrode 1 uses ITO/Ag/ITO stacked, and the second electrode 2 uses Ag. The Ag in the first electrode 1 is thicker for reflection, and the Ag in the second electrode 2 is thinner (about 8 nm) for light transmission. The material of the hole injection layer 6 is PEDOT, the material of the hole transport layer 7 is TFB, the material of the electron transport layer 5 is ZnO, the color of the light emitted by the host quantum dot in the light-emitting layer 3 is green (i.e., green host quantum dot G-QD), the material of the first film layer 10 is SiO2, and the material of the second film layer is Si3N4. As shown in FIG. 17, FIG. 17 is a graph of the influence of the thickness changes of SiO2 and Si3N4 on the efficiency of the light-emitting device shown in FIG. 16. It can be seen that the efficiency of the light-emitting device is better when the thickness of SiO2 is 15 nm to 25 nm and the thickness of Si3N4 is 55 nm to 65 nm. Therefore, in a possible implementation, the thickness of the first film layer 10 is 15 nm to 25 nm and the thickness of the second film layer 20 is 55 nm to 65 nm in the green light-emitting device provided by an embodiment of the disclosure. Therefore, the efficiency of the green upright top-emitting structure device can be effectively improved through the reasonable design of the optical modulation part.

In a specific implementation, in the above-mentioned light-emitting device provided by embodiments of the disclosure, the light-emitting device shown in FIG. 14 and FIG. 16 may further include another first film layer 10 and another second film layer 20 on the side of the second film layer 20 away from the base 5, to further enhance the device efficiency.

Based on the same inventive concept, an embodiment of the disclosure further provides a manufacturing method for the above-mentioned light-emitting device, including: preparing a first electrode, a second electrode, a light-emitting layer and a color filter layer in each sub-pixel; where a light-emitting layer of at least one sub-pixel in at least one pixel unit includes a host quantum dot and at least one residual quantum dot of a different luminous color from the host quantum dot; the color filter layer is located on a side of the first electrode or the second electrode away from the light-emitting layer, and configured to transmit light emitted by the host quantum dot and prevent light emitted by the residual quantum dot from passing through.

Figure 18:
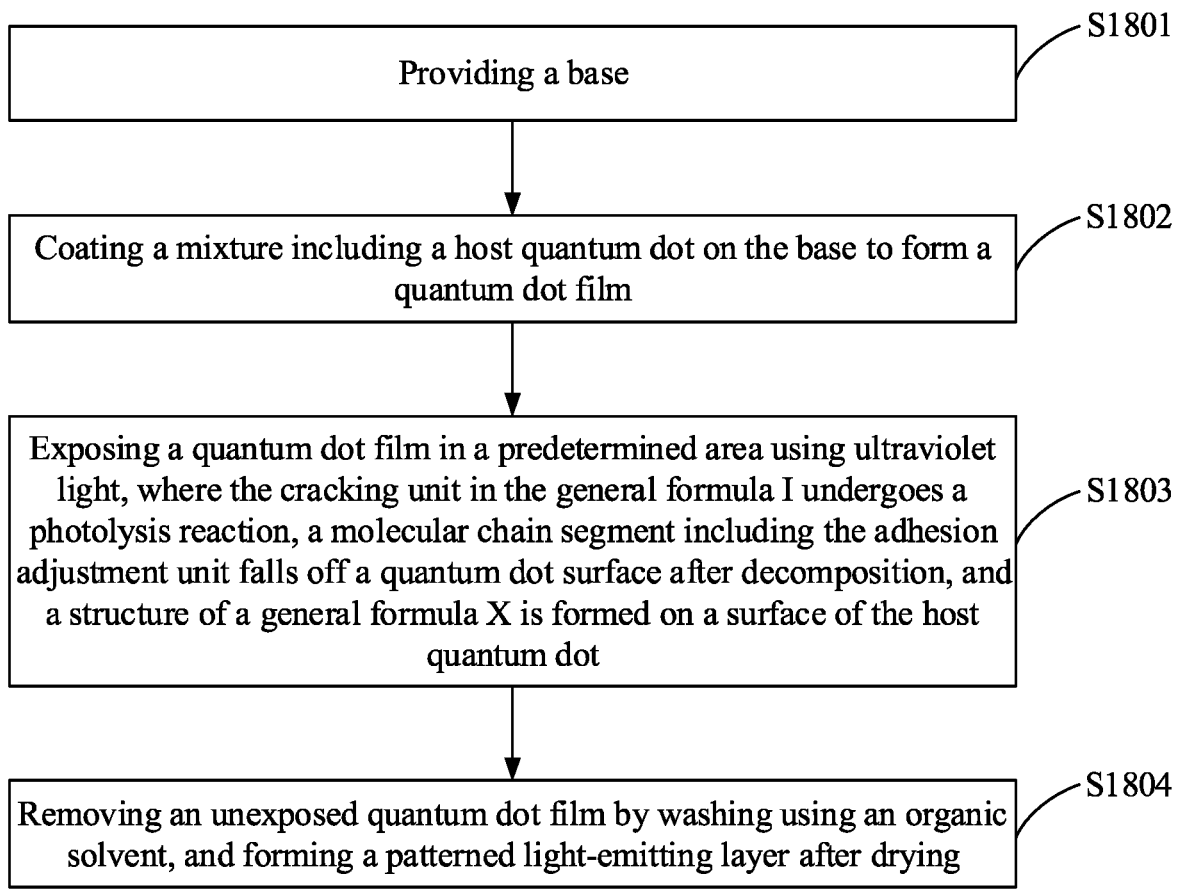
FIG. 18 is a schematic flow chart of a method for patterning a light-emitting layer according to an embodiment of the disclosure.

In a specific implementation, in the above-mentioned manufacturing method provided by an embodiment of the disclosure, as shown in FIG. 18, preparing the light-emitting layer may include following steps.

S1801: providing a base.

S1802: coating a mixture including a host quantum dot on the base to form a quantum dot film; where a surface of the host quantum dot is connected with a structure as shown in a general formula I:

$$A\text{-}B\text{—}C \qquad (I);$$

where A is a coordination unit, B is a cracking unit, and C is an adhesion adjustment unit;

the coordination unit includes any one of a mercapto group, a hydroxyl group, an amino group, a carboxyl group, a phosphoric acid group, a phosphatide group or a sulfonic acid group;

the cracking unit has a structure as shown in formulas II to IV;

the adhesion adjustment unit is a perfluoroalkyl group including more than 3 carbon atoms, or a group including more than 8 hydrophilic functional groups, or a molecular chain including more than 8 hydrophilic functional groups; where the hydrophilic functional group is a hydroxyl group, an aldehyde group, an ester group or an ether group;

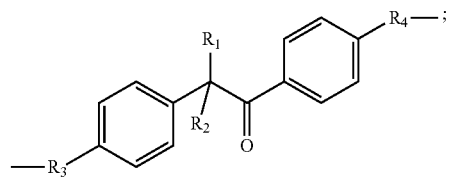

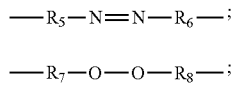

where $R_1$ is selected from hydrogen, alkoxy, alkyl or aryl; and $R_2$ is selected from hydrogen, alkoxy, alkyl or aryl; $R_3$ is selected from hydrogen, alkylene or arylene; $R_4$ is selected from hydrogen, alkylene or arylene; $R_5$ is selected from hydrogen, alkylene or arylene; $R_6$ is selected from hydrogen, alkylene or arylene; $R_7$ is selected from hydrogen, alkylene or arylene; and $R_8$ is selected from hydrogen, alkylene or arylene; where, for a structure shown in the general formula I, the base has hydrophobic property when the adhesion adjustment unit has hydrophilic property; or the base has hydrophilic property when the adhesion adjustment unit has hydrophobic property.

S1803: exposing a quantum dot film in a predetermined area using ultraviolet light, where the cracking unit in the general formula I undergoes a photolysis reaction, a molecular chain segment including the adhesion adjustment unit falls off a quantum dot surface after decomposition, and a structure of a general formula X is formed on a surface of the host quantum dot.

S1804: removing an unexposed quantum dot film by washing using an organic solvent, and forming a patterned light-emitting layer after drying.

Figure 19:
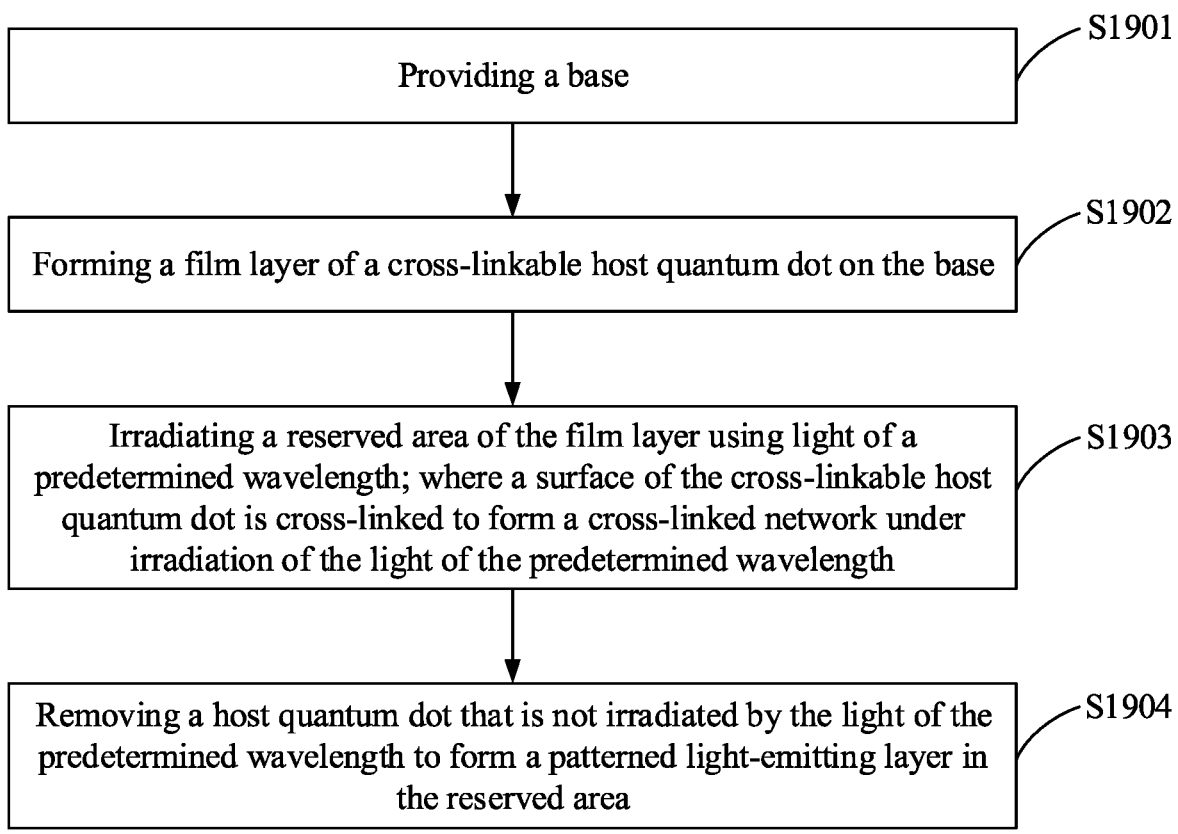
FIG. 19 is a schematic flow chart of another method for patterning a light-emitting layer according to an embodiment of the disclosure.

In a specific implementation, in the above-mentioned manufacturing method provided by an embodiment of the disclosure, as shown in FIG. 19, preparing the light-emitting layer may include following steps.

S1901: providing abase.

S1902: forming a film layer of a cross-linkable host quantum dot on the base.

S1903: irradiating a reserved area of the film layer using light of a predetermined wavelength; where a surface of the cross-linkable host quantum dot is cross-linked to form a cross-linked network under irradiation of the light of the predetermined wavelength.

S1904: removing a host quantum dot that is not irradiated by the light of the predetermined wavelength to form a patterned light-emitting layer in the reserved area.

The manufacturing method for the light-emitting device provided by an embodiment of the disclosure and shown in FIG. 1 to FIG. 4 will be briefly described below by a specific example. Preparation methods for the film layers in the light-emitting device include but not limited to one or more of spin coating method, evaporation method, chemical vapor deposition method, physical vapor deposition method, magnetron sputtering method and the like.

The steps of manufacturing the light-emitting device shown in FIG. 1 are as follows.

(1) Clean: the base 5 is ultrasonically cleaned using isopropanol, water and acetone respectively, and treated using UV for 5 to 10 min. Then the first electrode 1 is fabricated on the base 5.

(2) Introduce a hole injection layer: the hole injection layer 7 is prepared on the first electrode 1 by spin coating, evaporation or inkjet printing; and the hole injection layer 7 may be selected from PEDOT:PSS 4083 (poly 3,4-ethylenedioxythiophene/polystyrene sulfonate) or other commercial compounds suitable for the hole injection layer 7, where the film-forming temperature of the PEDOT is 130° C. to 150° C. in air. The rotate speed of the homogenizer is set to 500 to 2500 rpm to adjust the thickness of the film layer.

(3) Introduce a hole transport layer: the hole transport layer 8 is prepared on the hole injection layer 7 by spin coating, evaporation or inkjet printing.

(4) Introduce a light-emitting layer: the light-emitting layer 3 including quantum dots of three colors is prepared on the hole transport layer 8 through the above-mentioned steps S1401-S404, where the quantum dots include CdS, CdSe, CdTe, ZnSe, InP, PbS, CuInS2, ZnO, CsPbCl3, CsPbBr3, CsPhI3, CdS/ZnS, CdSe/ZnS, ZnSe, InP/ZnS, PbS/ZnS, InAs, InGaAs, InGaN, GaNk, ZnTe, Si, Ge, C or other nanoscale materials with the above compositions, such as nanorod, nanosheet. Optionally, the quantum dots are cadmium-free quantum dots.

(5) Introduce an electron transport layer: the electron transport layer 6 is introduced on the conductive glass spin-coated with the light-emitting layer, and may be selected from a zinc oxide nanoparticle film or a zinc oxide sol-gel film.

(a) Zinc oxide nanoparticle film: for example, add 90-120 µL of 10-30 mg/mL zinc oxide nanoparticles dropwise onto the above-mentioned glass substrate, set the rotate speed of the homogenizer to be 500 to 2500 rpm and spin coat to form a film, and form a film at the room temperature or by heating (25° C. to 120° C.), to adjust the thickness of the zinc oxide film layer.

(b) Sol-gel film: add 2 g of zinc acetate to a solvent including 10 mL of ethanolamine and n-butanol, spin-coat to form a film at a rotate speed of 1000 to 4000 rpm, and heat on a hot stage at 180° C. to 250° C. to form a film.

The material of the electron transport layer may also be selected from ion-doped zinc oxide nanoparticles, such as Mg, In, Al, Ga-doped magnesium oxide nanoparticles and the like.

(6) Introduce a second electrode: the material of the second electrode 2 is finally introduced, for example, an Al film or Ag film is evaporated, and an IZO film or MgAg alloy film is sputtered, to prepare the light-emitting device.

(7) Introduce a distributed Bragg reflector: the reflective units are respectively introduced into the pixel areas corresponding to RGB to prepare a full-color device.

Figure 4:
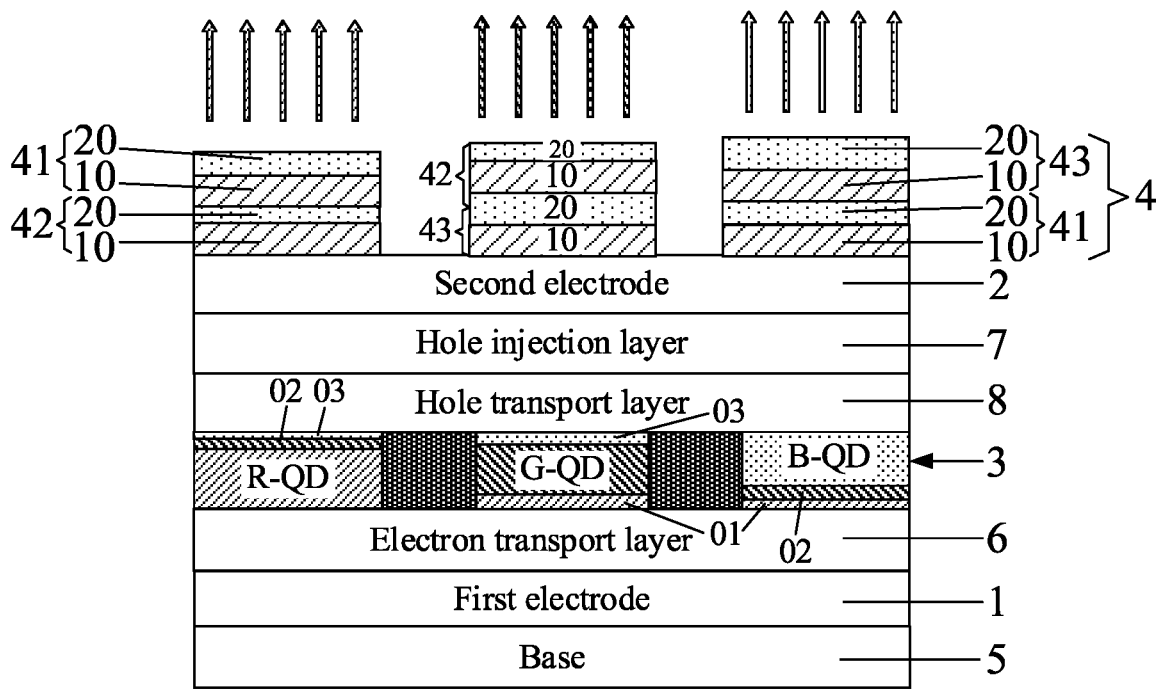
FIG. 4 is a schematic structural diagram of another light-emitting device according to an embodiment of the disclosure.

The process for preparing the film layers in the light-emitting devices shown in FIG. 2, FIG. 3 and FIG. 4 is the same as the process for preparing the film layers in the device structure shown in FIG. 1. The difference of the preparation method shown in FIG. 2, FIG. 3 and FIG. 4 from the preparation method shown in FIG. 1 is the fabrication sequence of the film layers, which will not be described in detail here.

In a specific implementation, the light-emitting device provided by an embodiment of the disclosure also includes other functional film layers well known to those skilled in the art, which will not be described in detail here.

Based on the same disclosure concept, an embodiment of the disclosure further provides a display apparatus, including the above-mentioned light-emitting device provided by embodiments of the disclosure. The display apparatus may be: a mobile phone, a tablet, a television, a display, a laptop, a digital photo frame, a navigator, or any other product or component with display function. All of other indispensable components of the display apparatus should be understood by those ordinary skilled in the art to be included, and will be omitted here and should not be considered as limitations on the disclosure. The principle of the display apparatus to solve the problem is similar to that of the above-mentioned light-emitting device, so implementations of the display apparatus can refer to implementations of the above-mentioned light-emitting device, and the detailed description thereof will be omitted here.

In the light-emitting device and manufacturing method therefor and the display apparatus provided by embodiments of the disclosure, by arranging the color filter layer on the side of the first electrode or the second electrode away from the light-emitting layer, on the one hand, the light with a color different from the light emitted by the light-emitting layer can be eliminated, thereby solving the problem of color mixing when patterning quantum dots by photolithography; and on the other hand, the purity of luminous color can be improved, thereby improving the color gamut of the light-emitting device.

Although embodiments of the disclosure have been described, those skilled in the art can make additional alterations and modifications to these embodiments once they learn about the basic creative concepts. Thus, the attached claims are intended to be interpreted to include embodiments as well as all the alterations and modifications falling within the scope of the disclosure.

Evidently, those skilled in the art can make various modifications and variations to embodiments of the disclosure without departing from the spirit and scope of embodiments of the disclosure. Thus, the disclosure is also intended to encompass these modifications and variations to embodiments of the disclosure as long as these modifications and variations come into the scope of the claims of the disclosure and their equivalents.

What is claimed is:

1. A light-emitting device, comprising a plurality of pixel units, each of the pixel units comprises at least n sub-pixels capable of emitting light of n different colors, wherein:
   each of the sub-pixels comprises:
   a first electrode and a second electrode arranged oppositely;
   a light-emitting layer located between the first electrode and the second electrode, wherein a light-emitting layer of at least one sub-pixel in at least one of the pixel units comprises a host quantum dot and at least one residual quantum dot of a different luminous color from the host quantum dot;
   a color filter layer located on a side of the first electrode or the second electrode away from the light-emitting layer, and configured to transmit light emitted by the host quantum dot and prevent light emitted by the residual quantum dot from passing through.

2. The light-emitting device according to claim 1, wherein a surface of the host quantum dot is connected with a structure as shown in a general formula X:

A-B'(X);

wherein A is a coordination unit, and B' is a residual unit, the coordination unit comprises at least one of a mercapto group, a hydroxyl group, an amino group, a carboxyl group, a phosphoric acid group, a phosphatide group or a sulfonic acid group;
   the residual unit comprises at least one of structures shown in following formulas;

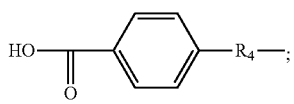

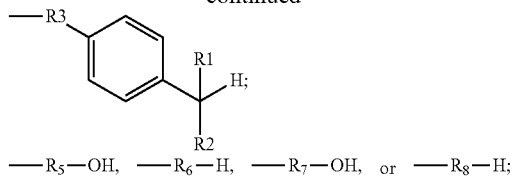

wherein $R_1$ is selected from hydrogen, alkoxy, alkyl or aryl; and $R_2$ is selected from hydrogen, alkoxy, alkyl or aryl;
$R_3$ is selected from hydrogen, alkylene or arylene; $R_4$ is selected from hydrogen, alkylene or arylene; $R_5$ is selected from hydrogen, alkylene or arylene; $R_6$ is selected from hydrogen, alkylene or arylene; $R_7$ is selected from hydrogen, alkylene or arylene; and $R_8$ is selected from hydrogen, alkylene or arylene.

3. The light-emitting device according to claim 1, wherein a surface of the host quantum dot is connected with a cross-linked network;
   wherein the cross-linked network is formed by cross-linking a group pair R9 and R10, and the R9 and R10 are respectively cross-linkable ligands before the cross-linked network is formed on the surface of the host quantum dot; or
   the cross-linked network is formed by cross-linking a cross-linking agent and a group R11, the group R11 is a cross-linkable ligand before the cross-linked network is formed on the surface of the host quantum dot.

4. The light-emitting device according to claim 1, wherein, in the light-emitting layer of the sub-pixel comprising the residual quantum dot, a molar ratio of the residual quantum dot to all quantum dots is less than 10%.

5. The light-emitting device according to claim 1, wherein each of the pixel units comprises a red sub-pixel, a green sub-pixel and a blue sub-pixel, the red sub-pixel comprises a red host quantum dot, the green sub-pixel comprises a green host quantum dot, and the blue sub-pixel comprises a blue host quantum dot.

6. The light-emitting device according to claim 5, wherein a molar ratio of residual quantum dots to all quantum dots in the red sub-pixel, a molar ratio of residual quantum dots to all quantum dots in the green sub-pixel, and a molar ratio of residual quantum dots to all quantum dots in the blue sub-pixel decrease sequentially.

7. The light-emitting device according to claim 1, wherein the color filter layer comprises a plurality of color resists of different colors in one-to-one correspondence with sub-pixels emitting light of different colors.

8. The light-emitting device according to claim 5, wherein the color filter layer comprises a plurality of optical modulation parts corresponding to the sub-pixels, and each of the sub-pixels comprises one of the optical modulation parts;
   an optical modulation part corresponding to the red sub-pixel is a first long-pass filter, a starting wavelength of the first long-pass filter is less than a wavelength corresponding to a luminous peak of the red host quantum dot and greater than a wavelength corresponding to a luminous peak of the green host quantum dot;
   an optical modulation part corresponding to the blue sub-pixel is a short-pass filter, a cut-off wavelength of the short-pass filter is less than the wavelength corresponding to the luminous peak of the green host quantum dot and greater than a wavelength corresponding to a luminous peak of the blue host quantum dot;

and an optical modulation part corresponding to the green sub-pixel is a second long-pass filter, a starting wavelength of the second long-pass filter is less than the wavelength corresponding to the luminous peak of the green host quantum dot and greater than the wavelength corresponding to the luminous peak of the blue host quantum dot.

9. The light-emitting device according to claim 5, wherein the color filter layer comprises a plurality of optical modulation parts corresponding to the sub-pixels, and each of the sub-pixels comprises one of the optical modulation parts;
   an optical modulation part corresponding to the red sub-pixel is a first band-pass filter, a starting wavelength of the first band-pass filter is less than a wavelength corresponding to a luminous peak of the red host quantum dot and greater than a wavelength corresponding to a luminous peak of the green host quantum dot, and a cut-off wavelength of the first band-pass filter is greater than the wavelength corresponding to the luminous peak of the red host quantum dot;
   an optical modulation part corresponding to the green sub-pixel is a second band-pass filter, a starting wavelength of the second band-pass filter is less than the wavelength corresponding to the luminous peak of the green host quantum dot and greater than a wavelength corresponding to a luminous peak of the blue host quantum dot, and a cut-off wavelength of the second band-pass filter is greater than the wavelength corresponding to the luminous peak of the green host quantum dot and less than the wavelength corresponding to the luminous peak of the red host quantum dot;
   an optical modulation part corresponding to the blue sub-pixel is a third band-pass filter, a starting wavelength of the third band-pass is less than the wavelength corresponding to the luminous peak of the blue host quantum dot, and a cut-off wavelength of the third band-pass is greater than the wavelength corresponding to the luminous peak of the blue host quantum dot and less than the wavelength corresponding to the luminous peak of the green host quantum dot.

10. The light-emitting device according to claim 5, wherein the color filter layer comprises a plurality of optical modulation parts corresponding to the sub-pixels, and each of the sub-pixels comprises two optical modulation parts stacked; one of the optical modulation parts in the red sub-pixel prevents blue light from passing through, and another one of the optical modulation parts in the red sub-pixel prevents green light from passing through; one of the optical modulation parts in the green sub-pixel prevents blue light from passing through, and another one of the optical modulation parts in the green sub-pixel prevents red light from passing through; one of the optical modulation parts in the blue sub-pixel prevents red light from passing through, and another one of the optical modulation parts in the blue sub-pixel prevents green light from passing through.

11. The light-emitting device according to claim 8, wherein the optical modulation part comprises at least one first film layer and at least one second film layer alternately stacked; and a refractive index of the first film layer is different from a refractive index of the second film layer.

12. The light-emitting device according to claim 8, wherein the first electrode is a transparent electrode, and the second electrode is a reflective electrode; and the optical modulation part is located on a side of the first electrode away from the second electrode; or the first electrode is a reflective electrode, and the second electrode partially transmits and partially reflects light in a visible light band; and the optical modulation part is located on a side of the second electrode away from the first electrode.

13. The light-emitting device according to claim 11, wherein materials of first film layers in optical modulation parts that reflect light of different colors are same, and materials of second film layers in the optical modulation parts that reflect light of different colors are same;
   thicknesses of the first film layers are same; and a thickness of a second film layer in an optical modulation part reflecting red light, a thickness of a second film layer in an optical modulation part reflecting green light, and a thickness of a second film layer in an optical modulation part reflecting blue light decrease sequentially; or
   thicknesses of the second film layers are same; and a thickness of a first film layer in an optical modulation part reflecting red light, a thickness of a first film layer in an optical modulation part reflecting green light, and a thickness of a first film layer in an optical modulation part reflecting blue light decrease sequentially.

14. The light-emitting device according to claim 11, wherein a material of the first film layer comprises InGaAsP, InAlGaN, SiO2, TiO2, Si3N4, Au or Ag; a material of the second film layer comprises InGaAsP, InAlGaN, SiO2, TiO2, Si3N4, Au or Ag; and the material of the first film layer is different from the material of the second film layer.

15. The light-emitting device according to claim 10, wherein the optical modulation part comprises at least one first film layer and at least one second film layer alternately stacked;
   the first electrode is a reflective electrode, the second electrode partially transmits and partially reflects light in a visible light band, and the optical modulation parts are located on a side of the second electrode away from the first electrode;
   when a color of light emitted by the host quantum dot in the light-emitting layer is blue, a material of the first film layer is SiO2, a material of the second film layer is Si3N4, a thickness of the first film layer closest to the second electrode is 5 nm to 15 nm, and a thickness of the second film layer closest to the second electrode is approximately 35 nm to 45 nm;
   when a color of light emitted by the host quantum dot in the light-emitting layer is red, a material of the first film layer is SiO2, a material of the second film layer is Si3N4, a thickness of the first film layer closest to the second electrode is 55 nm to 65 nm, and a thickness of the second film layer closest to the second electrode is approximately 55 nm to 65 nm;
   when a color of light emitted by the host quantum dot in the light-emitting layer is green, a material of the first film layer is SiO2, a material of the second film layer is Si3N4, a thickness of the first film layer closest to the second electrode is 15 nm to 25 nm, and a thickness of the second film layer closest to the second electrode is approximately 55 nm to 65 nm.

16. The light-emitting device according to claim 1, wherein:
   the light-emitting device further comprises: an electron transport layer between the first electrode and the light-emitting layer, a hole injection layer between the light-emitting layer and the second electrode, and a hole transport layer between the hole injection layer and the light-emitting layer; wherein a material of the electron transport layer comprises an inorganic electron transport material;

or, the light-emitting device further comprises: a hole transport layer between the first electrode and the light-emitting layer, a hole injection layer between the first electrode and the hole transport layer, and an electron transport layer between the light-emitting layer and the second electrode; wherein the hole transport layer comprises an inorganic hole transport material;

wherein the host quantum dot comprises at least one of CdS, CdSe, CdTe, ZnSe, InP, PbS, CuInS2, ZnO, CsPbCl3, CsPbBr3, CsPhI3, CdS/ZnS, CdSe/ZnS, ZnSe, InP/ZnS, PbS/ZnS, InAs, InGaAs, InGaN, GaNk, ZnTe, Si, Ge, C, nanorod.

17. A manufacturing method for the light-emitting device according to claim 1, comprising:

preparing a first electrode, a second electrode, a light-emitting layer and a color filter layer in each of the sub-pixels; wherein a light-emitting layer of at least one sub-pixel in at least one of the pixel units comprises a host quantum dot and at least one residual quantum dot of a different luminous color from the host quantum dot;

the color filter layer is located on a side of the first electrode or the second electrode away from the light-emitting layer, and configured to transmit light emitted by the host quantum dot and prevent light emitted by the residual quantum dot from passing through.

18. The manufacturing method according to claim 17, wherein preparing the light-emitting layer, comprises:

providing a base;

coating a mixture comprising a host quantum dot on the base to form a quantum dot film;

wherein a surface of the host quantum dot is connected with a structure as shown in a general formula I:

A-B—C    (I);

wherein A is a coordination unit, B is a cracking unit, and C is an adhesion adjustment unit;

the coordination unit comprises any one of a mercapto group, a hydroxyl group, an amino group, a carboxyl group, a phosphoric acid group, a phosphatide group or a sulfonic acid group;

the cracking unit has a structure as shown in formulas II to IV;

the adhesion adjustment unit is a perfluoroalkyl group comprising more than 3 carbon atoms, or a group comprising more than 8 hydrophilic functional groups, or a molecular chain comprising more than 8 hydrophilic functional groups; wherein the hydrophilic functional group is a hydroxyl group, an aldehyde group, an ester group or an ether group;

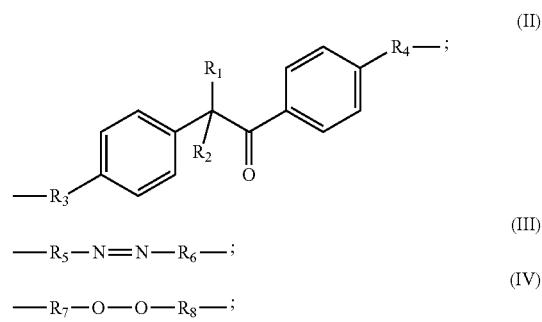

wherein $R_1$ is selected from hydrogen, alkoxy, alkyl or aryl; and $R_2$ is selected from hydrogen, alkoxy, alkyl or aryl;

$R_3$ is selected from hydrogen, alkylene or arylene; $R_4$ is selected from hydrogen, alkylene or arylene; $R_5$ is selected from hydrogen, alkylene or arylene; $R_6$ is selected from hydrogen, alkylene or arylene; $R_7$ is selected from hydrogen, alkylene or arylene; and $R_8$ is selected from hydrogen, alkylene or arylene; wherein, for a structure shown in the general formula I, the base has hydrophobic property when the adhesion adjustment unit has hydrophilic property; or the base has hydrophilic property when the adhesion adjustment unit has hydrophobic property;

exposing a quantum dot film in a predetermined area using ultraviolet light, wherein the cracking unit in the general formula I undergoes a photolysis reaction, a molecular chain segment comprising the adhesion adjustment unit falls off a quantum dot surface after decomposition, and a structure of a general formula X is formed on a surface of the host quantum dot;

removing an unexposed quantum dot film by washing using an organic solvent, and forming a patterned light-emitting layer after drying.

19. The manufacturing method according to claim 17, wherein preparing the light-emitting layer, comprises:

providing a base;

forming a film layer of a cross-linkable host quantum dot on the base;

irradiating a reserved area of the film layer using light of a predetermined wavelength; wherein a surface of the cross-linkable host quantum dot is cross-linked to form a cross-linked network under irradiation of the light of the predetermined wavelength;

removing a host quantum dot that is not irradiated by the light of the predetermined wavelength to form a patterned light-emitting layer in the reserved area.

20. A display apparatus, comprising the light-emitting device according to claim 1.

* * * * *